(12) United States Patent
Kim

(10) Patent No.: US 7,372,767 B2
(45) Date of Patent: May 13, 2008

(54) NONVOLATILE SEMICONDUCTOR MEMORY DEVICE HAVING MULTI-LEVEL MEMORY CELLS AND PAGE BUFFER USED THEREFOR

(75) Inventor: Ho Jung Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/607,027

(22) Filed: Dec. 1, 2006

(65) Prior Publication Data

US 2007/0195636 A1    Aug. 23, 2007

(30) Foreign Application Priority Data

Feb. 17, 2006    (KR) .................. 10-2006-0015795

(51) Int. Cl.
*G11C 8/00*    (2006.01)
(52) U.S. Cl. .................. 365/230.06; 365/230.08; 365/189.05; 365/185.17
(58) Field of Classification Search .......... 365/230.06, 365/230.08, 185.17, 185.12, 189.05
See application file for complete search history.

(56) References Cited

U.S. PATENT DOCUMENTS 6,996,014 B2 *    2/2006    Lee et al. ............ 365/189.05
7,187,584 B2 *    3/2007    Chang ................. 365/185.17
7,190,618 B2 *    3/2007    Byeon ................. 365/185.12

FOREIGN PATENT DOCUMENTS

| KR | 1020000059746 A | 10/2000 |
|---|---|---|
| KR | 1020050094569 A | 9/2005 |
| KR | 1020050095191 A | 9/2005 |

\* cited by examiner

*Primary Examiner*—Anh Phung
*Assistant Examiner*—Toan Le
(74) *Attorney, Agent, or Firm*—Volentine & Whitt, PLLC

(57) ABSTRACT

A non-volatile semiconductor memory device includes a memory array having nonvolatile memory cells. The memory device also includes a page buffer coupled to the memory array through first and second common bit lines and configured to map a set of first to third bit data to threshold voltage levels of a pair of first and second memory cells. The memory device also includes a row decoder configured to control a word line of a selected memory cell of the memory array. The page buffer includes a switch, a first latch block, a second latch block, a dumping block, and an output block.

13 Claims, 30 Drawing Sheets

<RESULTS OF READING OF PREVIOUS DATA>

| BIT3 | PREVIOUS DATA VALUE BIT1/BIT2 | AFTER READING DLT1/DLT2 | CASE |
|---|---|---|---|
| 0 | (1/1) | L/L | CASE31 |
| | (1/0) | H/L | CASE32 |
| | (0/1) | L/H | CASE33 |
| | (0/0) | H/L | CASE34 |
| 1 | (DON'T CARE) | H/H | CASE35 |

FIG. 16

NONVOLATILE SEMICONDUCTOR MEMORY DEVICE HAVING MULTI-LEVEL MEMORY CELLS AND PAGE BUFFER USED THEREFOR

BACKGROUND OF THE INVENTION

1. Field of the Invention

The present invention relates to a semiconductor memory device and, more particularly, to a multi-level nonvolatile semiconductor memory device including multi-level memory cells and corresponding page buffers.

A claim of priority is made to Korean Patent Application No. 10-2006-15795, filed on Feb. 17, 2006, in the Korean Intellectual Property Office, the disclosure of which is incorporated herein in its entirety by reference.

2. Description of the Related Art

Non-volatile semiconductor memory devices have many distinguishing characteristics. One such characteristic includes the ability to preserve stored data even in the event of power loss to the semiconductor memory device. Furthermore, semiconductor memory devices include a number of memory cells. To this end, various types of memory cells appropriate for non-volatile semiconductor memory devices are known. One such memory cell is a transistor type memory cell.

FIG. 1 illustrates a transistor type memory cell MC. In general, the transistor type memory cell MC includes a number of components. For example, these components include a current path formed between a source S and a drain D on a semiconductor substrate. The components also include a floating gate FG formed between a dielectric oxide DOX and a gate oxide GOX. Furthermore, the components include a control gate CG.

Each component of the cell MC may perform one or more functions. For example, the floating gate FG traps electrons. These trapped electrons establish a threshold voltage of the memory cell MC. This established threshold voltage may be used in performing various operations on the cell MC. For example, when a non-volatile semiconductor memory device performs a read operation, the threshold voltage of the memory cell MC is detected and, thus, stored data is checked.

Typically, a transistor memory cell MC stores one of two data values. The two data values, as illustrated in FIG. 2, are determined by a threshold voltage that is set to one of two levels. For example, data is read as "1" when the threshold voltage of the memory cell MC is lower than a reference voltage VM, and data is read as "0" when the threshold voltage of the memory cell MC is higher than the reference voltage VM.

Due to the increase in demand for high integration density on semiconductor memory devices, efforts are being made towards increasing the amount of data that may be stored in a memory cell. To this end, semiconductor memory manufacturers have developed a 4-level memory cell.

FIG. 4 illustrates a 4-level memory cell. The illustrated 4-level memory cell can be programmed with one of four threshold voltage levels. As a result, the 4-level memory cell can store any one of four types of data, each data corresponding to a threshold voltage level. Therefore, a non-volatile semiconductor memory device having 4-level memory cells (hereinafter referred to as a "4-level non-volatile semiconductor memory device") has a data storage capacity that is twice that of a non-volatile semiconductor memory device having 2-level memory cells (hereinafter referred to as a "2-level non-volatile semiconductor memory device").

While the 4-level non-volatile semiconductor device has twice the data storage capacity of a 2-level non-volatile semiconductor device, it has several shortcomings. For example, in a 4-level memory cell, the margin of a threshold voltage between neighboring levels is very narrow (typically about 0.67 V.) Such a narrow margin between threshold voltages may lead to problems. For example, the stored voltage in each memory cell that represents a stored data value may change due to the leakage of electrons or the like. Accordingly, the stored voltage may cross over the threshold voltage range of that data value to a neighboring level threshold voltage that corresponds to a different data value. This crossing over of the threshold voltage in a memory cell to a neighboring level may cause the value of the data stored in a memory cell to be read incorrectly. Therefore, the reliability of a 4-level non-volatile semiconductor device may be reduced.

The present disclosure is directed towards overcoming one or more of the problems associated with the 4-level non-volatile semiconductor device.

SUMMARY OF THE INVENTION

One aspect of the present disclosure includes a nonvolatile semiconductor memory device. The memory device includes a memory array having nonvolatile memory cells. The memory device also includes a page buffer coupled to the memory array through first and second common bit lines and configured to map a set of first to third bit data to threshold voltage levels of a pair of first and second memory cells. The memory device also includes a row decoder configured to control a word line of a selected memory cell of the memory array. The page buffer comprises a switch which connects the first common bit line to the second common bit line. The page buffer also comprises a first latch block configured to store a first latch data, the first latch block being operably connected to the first common bit line through a first sensing node. The page buffer also comprises a second latch block configured to store a second latch data, the second latch block being operably connected to the second common bit line through a second sensing node. The page buffer also comprises a dumping block configured to control a voltage level of the second sensing node according to the first latch data, and to flip the first latch data according to the voltage level of the second sensing node. In addition, the page buffer also comprises an output block which outputs data according to the second latch data to an internal data line.

Another aspect of the present disclosure includes a page buffer of a nonvolatile semiconductor device. The page buffer comprises a sensing node. The page buffer also comprises a latch unit which stores latch data. The page buffer also comprises a precharge unit which precharges the sensing node. The page buffer also comprises a buffer selection unit which provides the latch data to the sensing node in response to a buffer selection signal. In addition the page buffer comprises a latch control unit which resets the latch data, the latch control unit being configured to flip the latch data according to a voltage level of the sensing node. The latch unit comprises a reset unit which resets the latch data. The latch unit also comprises a flip unit which flips the latch data according to the voltage level of the sensing node.

BRIEF DESCRIPTION OF THE DRAWINGS

The above and other features of the present invention will be more clearly understood from the following detailed description taken in conjunction with the accompanying drawings, in which:

FIG. 16 is a diagram showing the states of first and second latch data during a third page programming step in a programming method for an exemplary disclosed non-volatile semiconductor memory device of the present invention, based on FIGS. 14A and 14B;

DESCRIPTION OF THE PREFERRED EMBODIMENTS

Figure 1:
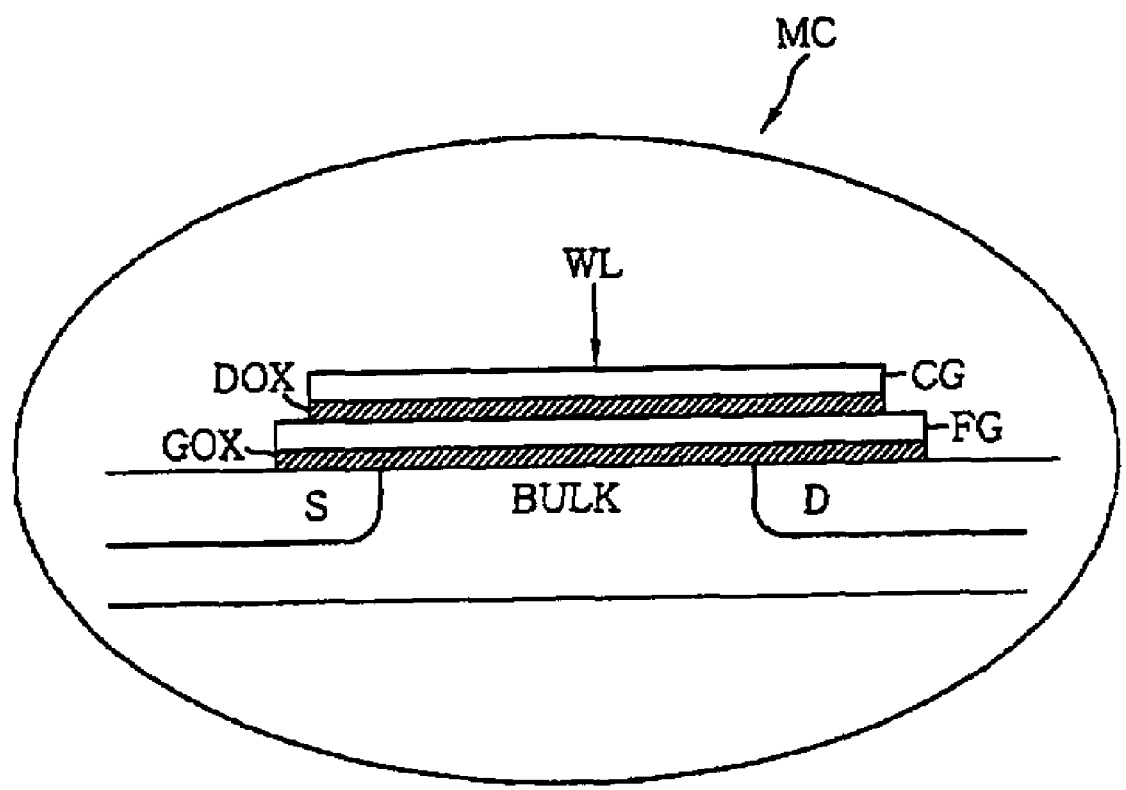
FIG. 1 is a sectional view showing a typical transistor-type memory cell.
Figure 2:
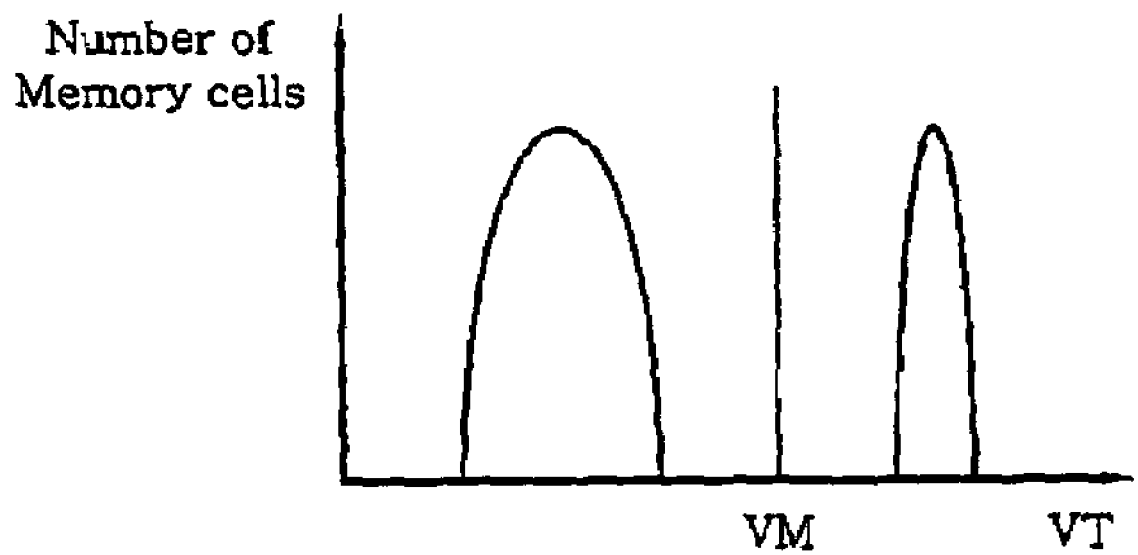
FIG. 2 is a graph showing the distribution of threshold voltages of 2-level memory cells.
Figure 3:
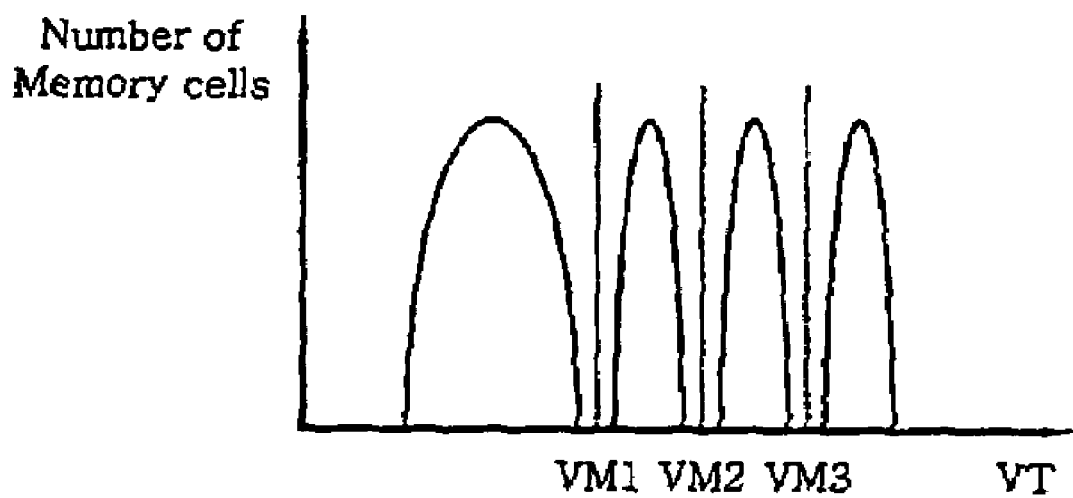
FIG. 3 is a graph showing the distribution of threshold voltages of 4-level memory cells.

Reference now should be made to the drawings, in which the same reference numerals are used throughout the different drawings to designate the same or similar components.

Figure 4:
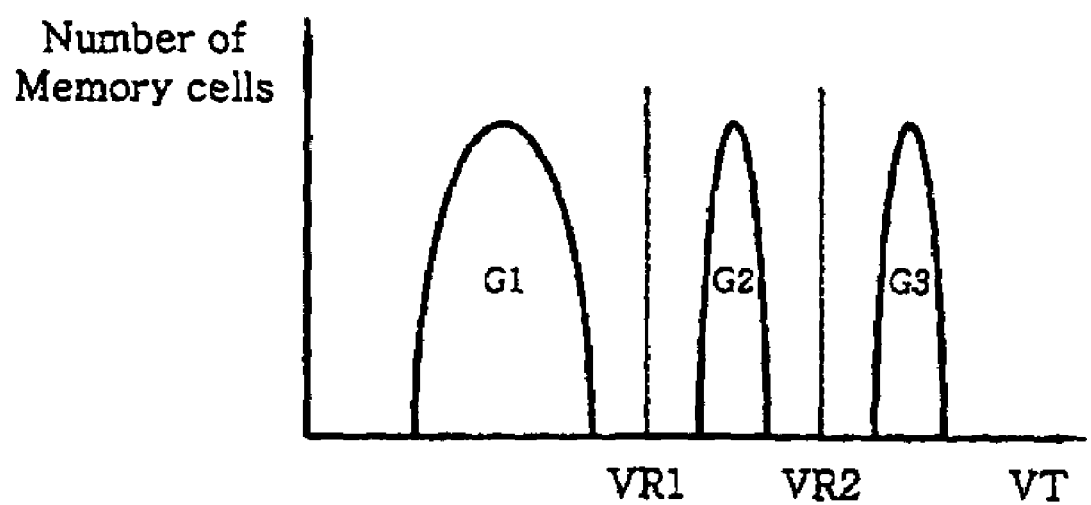
FIG. 4 is a graph showing the distribution of threshold voltages of 3-level memory cells.

In an exemplary disclosed embodiment, a non-volatile semiconductor memory device includes 3-level memory cells. FIG. 4 illustrates the threshold voltage distributions for a 3-level memory cell MC. Specifically, the 3-level memory cell MC, as illustrated in FIG. 4, may be programmed with threshold voltage groups having three levels. Furthermore, the threshold voltage groups of the memory cells MCs can be distinguished from each other using a first reference voltage VR1 and a second reference voltage VR2. In the present disclosure, a threshold voltage group lower than the first reference voltage VR1 is referred to as a "first threshold voltage group G1", while a threshold voltage group between the first reference voltage VR1 and the second reference voltage VR2 is referred to as a "second threshold voltage group G2". In addition, a threshold voltage group higher than the second reference voltage VR2 is referred to as a "third threshold voltage group G3".

In an exemplary embodiment of a non-volatile semiconductor memory device, the first reference voltage VR1 and the second reference voltage VR2 can be set to different levels for different operations on the memory device. For example, the reference voltages VR1 and VR2 may be set to one level in a read verify operation that verifies whether programming has succeeded, and to a different level in a normal read operation where stored data is read. In the present disclosure though, it is assumed only for convenience of disclosure that each of the first reference voltage VR1 and the second reference voltage VR2 does not vary in the read verify operation and in the normal read operation. However, one skilled in the art will appreciate that reference voltages VR1 and VR2 may vary between the read verify and normal read operations without departing from the scope of the present disclosure.

The 3-level memory cell has more data storage states compared to a 2-level memory cell. Because of having more data storage states, the 3-level memory cell is able to store more data and therefore has a relatively high degree of integration.

Furthermore, the interval between threshold voltage levels in a 3-level memory cell is larger than that of a 4-level memory cell. This larger interval between threshold voltages in the 3-level memory cell may increase the reliability of the 3-level memory cell as compared to that of the 4-level memory cell. Accordingly, a non-volatile semiconductor memory device having 3-level memory cells (in the present specification, referred to as a "3-level non-volatile semiconductor memory device") may be capable of higher integration and greater reliability than that of 2 and 4 level non-volatile semiconductor memory devices.

Figure 5:
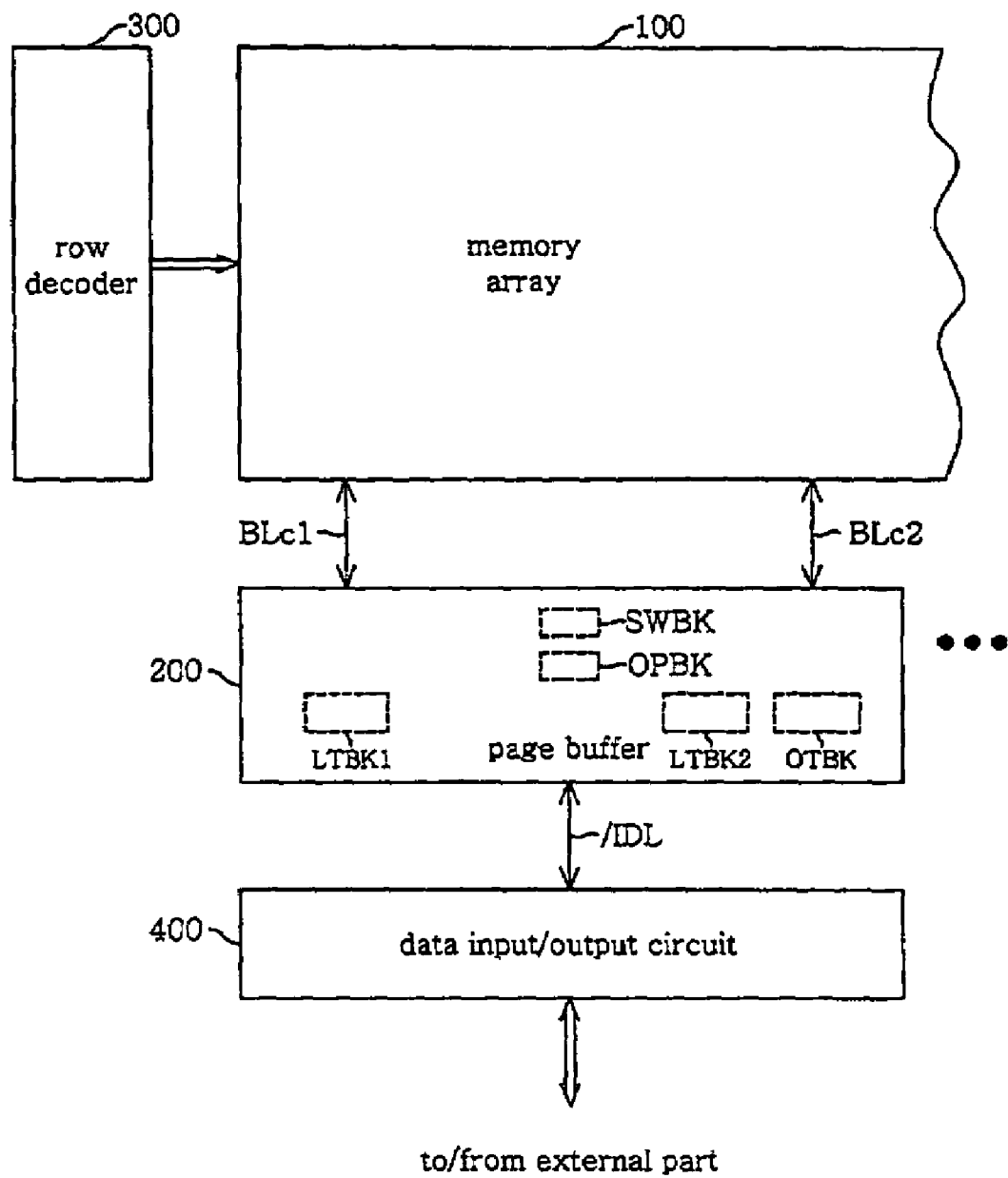
FIG. 5 is a diagram showing part of a non-volatile semiconductor memory device according to an exemplary disclosed embodiment of the present invention.

FIG. 5 is a diagram illustrating part of a non-volatile semiconductor memory device according to an exemplary disclosed embodiment. Referring to FIG. 5, a semiconductor device includes a memory array 100, a page buffer 200, a row decoder 300, and a data input/output circuit 400. The memory array 100 includes a plurality of memory cells. The memory cells are used to store data.

The page buffer 200 is configured to write data to the cells in the memory array 100. Specifically, the page buffer 200 may receive such data from the data input/output circuit 400 and then, after receiving such data, write the received data to the memory array 100. Similarly, the page buffer 200 may store data read from the memory array 100 before sending the read data to the data/input output circuit 400.

The row decoder 300 is configured to select the appropriate row including the required memory cell in the memory array 100. Specifically, the required memory cell is the cell which requires data to be written to or data to be read from.

The data input/output circuit provides a bidirectional transfer of data between the page buffer 200 and an external circuit.

Figure 6:
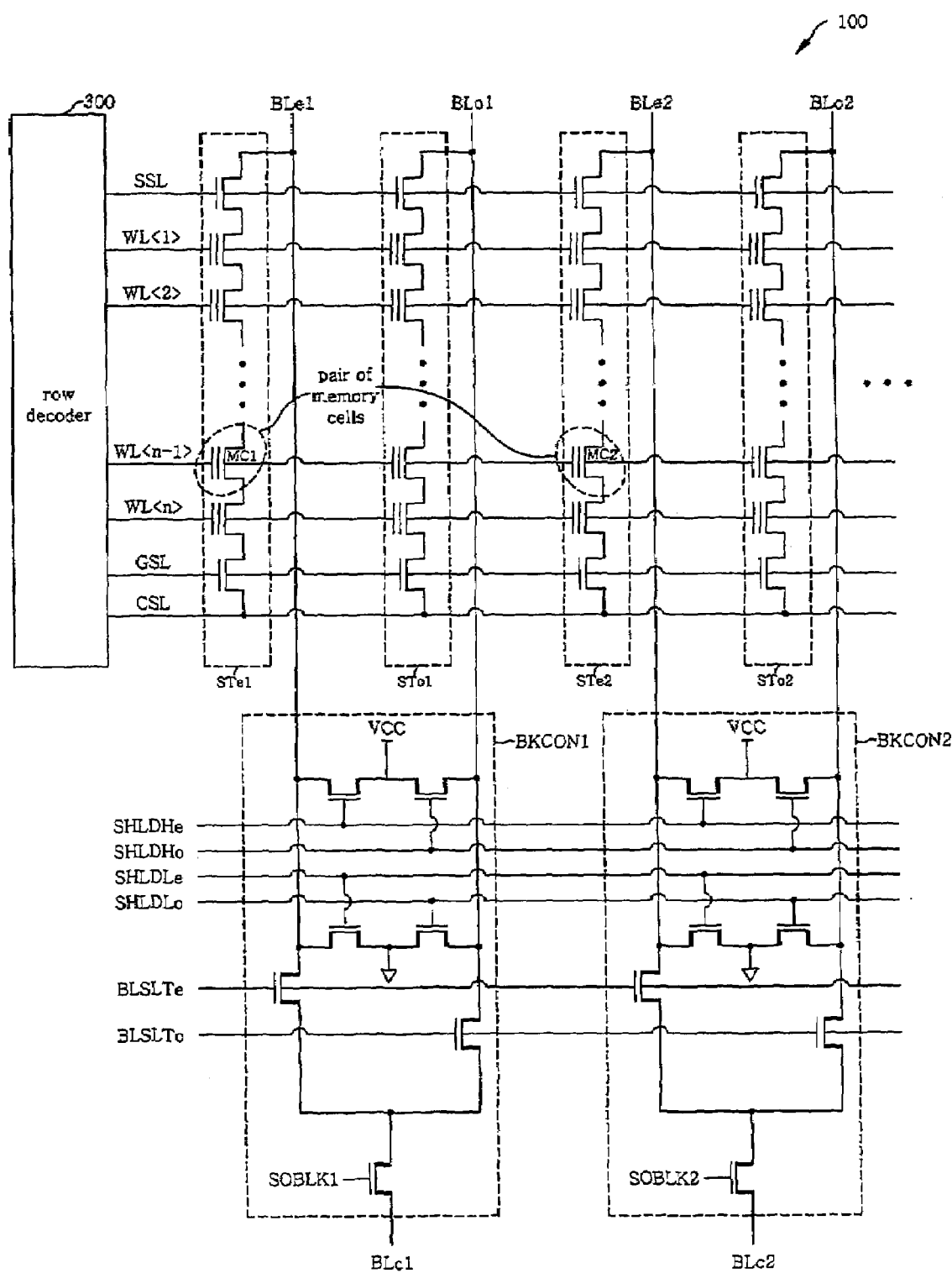
FIG. 6 is a circuit diagram showing part of the memory device of FIG. 5, which shows a NAND-type non-volatile semiconductor memory device.

FIG. 6 is a diagram showing part of the memory array 100 of FIG. 5. Specifically, the memory array 100 is a memory array of a NAND-type non-volatile semiconductor memory device. Furthermore, the memory array 100 includes a plurality of memory cells MC arranged in a matrix structure of rows and columns.

The memory array 100, as shown in FIG. 6, includes a first even string STe1, a first odd string STo1, a second even string STe2, and a second odd string STo2. Furthermore, the first even string STe1, the first odd string STo1, the second even string STe2, and the second odd string STo2 are connected to a first even bit line BLe1, a first odd bit line BLo1, a second even bit line BLe2, and a second odd bit line BLo2, respectively.

In addition, the first even bit line BLe1 and the first odd bit line BLo1 are selectively connected to a first common bit line BLc1 via a first common bit line control block BKCON1 during the data program and read operation. In particular, when an even bit line selection signal BLSLTe and the first sensing bit line signal SOBLK1 are activated to "H", the first even bit line BLe1 is connected with the first common bit line BLc1. Furthermore, in similar fashion, when an odd bit line selection signal BLSLTo and the first sensing bit line signal SOBLK1 are activated to "H", the first odd bit line BLo1 is connected with the first common bit line BLc1.

Similarly, the second even bit line BLe2 and the second odd bit line BLo2 are selectively connected to a second common bit line BLc2 via a second common bit line control block BKCON2 during the data program and read operation. Specifically, when an even bit line selection signal BLSLTe and the second sensing bit line signal SOBLK2 are activated to "H", the second even bit line BLe2 is connected with the second common bit line BLc2. In addition, when an odd bit line selection signal BLSLTo and the second sensing bit line signal SOBLK2 are activated to "H", the second odd bit line BLo2 is connected with the second common bit line BLc2.

In addition, the first even bit line BLe1 and the first odd bit line BLo1 are provided with a controllable voltage. Specifically, the first even bit line BLe1 and the first odd bit line BLo1 are provided with a power voltage VDD or a ground voltage VSS based on the control of the first common bit line control block BLCON1. Furthermore, the second even bit line BLe2 and the second odd bit line BLo2 are also provided with the power voltage VDD or the ground voltage VSS based on the control of the second common bit line control block BLCON2. In particular, the first and the second even bit line BLe1 and BLe2 are controlled to the power voltage VDD in response to an even high voltage shielding signal SHLDHe. Furthermore, the first and the second odd bit line BLo1 and BLo2 are controlled to the power voltage VDD in response to an odd high voltage shielding signal SHLDHo.

In addition, the first and the second even bit line BLe1 and BLe2 are controlled to the ground voltage VSS in response to an even low voltage shielding signal SHLDLe. Furthermore, the first and the second odd bit line BLo1 and BLo2 are controlled to the ground voltage VSS in response to an odd low voltage shielding signal SHLDLo.

A plurality of memory cells is included in the first even string STe1, the first odd string STo1, the second even string STe2 and the second odd string STo2. In this disclosure, a memory cell included in the first even string STe1 and the first odd string STo1 may be referred to as a 'first memory cell MC1', while a memory cell included in the second even string STe2 and the second odd string STo2 may be referred to as a 'second memory cell MC2'. This is for convenience of description only, and does not limit the claims following this disclosure.

In an exemplary embodiment, first memory cells MC1s and second memory cells MC2s may be implemented in the form of memory cells having the same structure. For example, the first memory cells MC1 and the second memory cells MC2 may be non-volatile memory cells that can be electrically programmed and erased and that can preserve data without the supply of power thereto.

Furthermore, in an exemplary embodiment, the first and the second memory cell MC1 and MC2 may constitute a pair and may be respectively distributed to and disposed in the first even string STe1 and the second even string STe2. Alternatively, the first and the second memory cell MC1 and MC2 are respectively distributed to and disposed in the first odd string Sto1 and the second odd string Sto2. Furthermore, the first and the second memory cells MC1 and MC2 constituting the pair are controlled with same word line WL<n−1> (refer to FIG. 6). Similarly, one of the first memory cells MC1 in the first odd STo1 and one of the second memory cells MC2 in the second odd string STo2 form another pair.

In an exemplary embodiment, each memory cell pair may be programmed with up to three bits of data. The three bits of data programmed in each memory cell pair may form a single group. Furthermore, the value of data stored in each memory cell pair is associated with a corresponding threshold voltage. Thus, the stored state of the first to third bit data can be read according to the threshold voltage associated with each state.

In the present disclosure, first to third bit data can be denoted by reference characters "BIT1 to BIT3". Furthermore, the data programming and reading method using the pair of memory cells will be described in detail later.

In an exemplary embodiment, for the pair of the first memory cell MC1 of the first even string STe1 and the second memory cell MC2 of the second even string Ste2, the first odd bit line BLo1 and the second odd bit line BLo2 function as shielding lines. Similarly, for the pair of the first memory cell MC1 of the first odd string STo1 and the second memory cell MC2 of the second odd string Sto2, the first even bit line BLe1 and the second even bit line BLe2 function as shielding lines. Thus, the even bit lines BLe1 and BLe2 or the odd bit lines BLo1 and BLo2 function as shielding lines, so that undesirable features such as, for example, noise and coupling are prevented. This prevention of undesirable features may result in an improvement in the operational characteristics of the non-volatile semiconductor memory device.

Referring to FIG. 5 again, the page buffer 200 is coupled to the memory array 100 through the first and the second common bit lines BLc1 and BLc2. The page buffer 200 may perform a number of functions. For example, the page buffer 200 is driven to map the first to third bit data BIT1 to BIT3 that form a group, to the threshold voltage groups of the pair of first and second memory cells MC1 and MC2.

Figure 7:
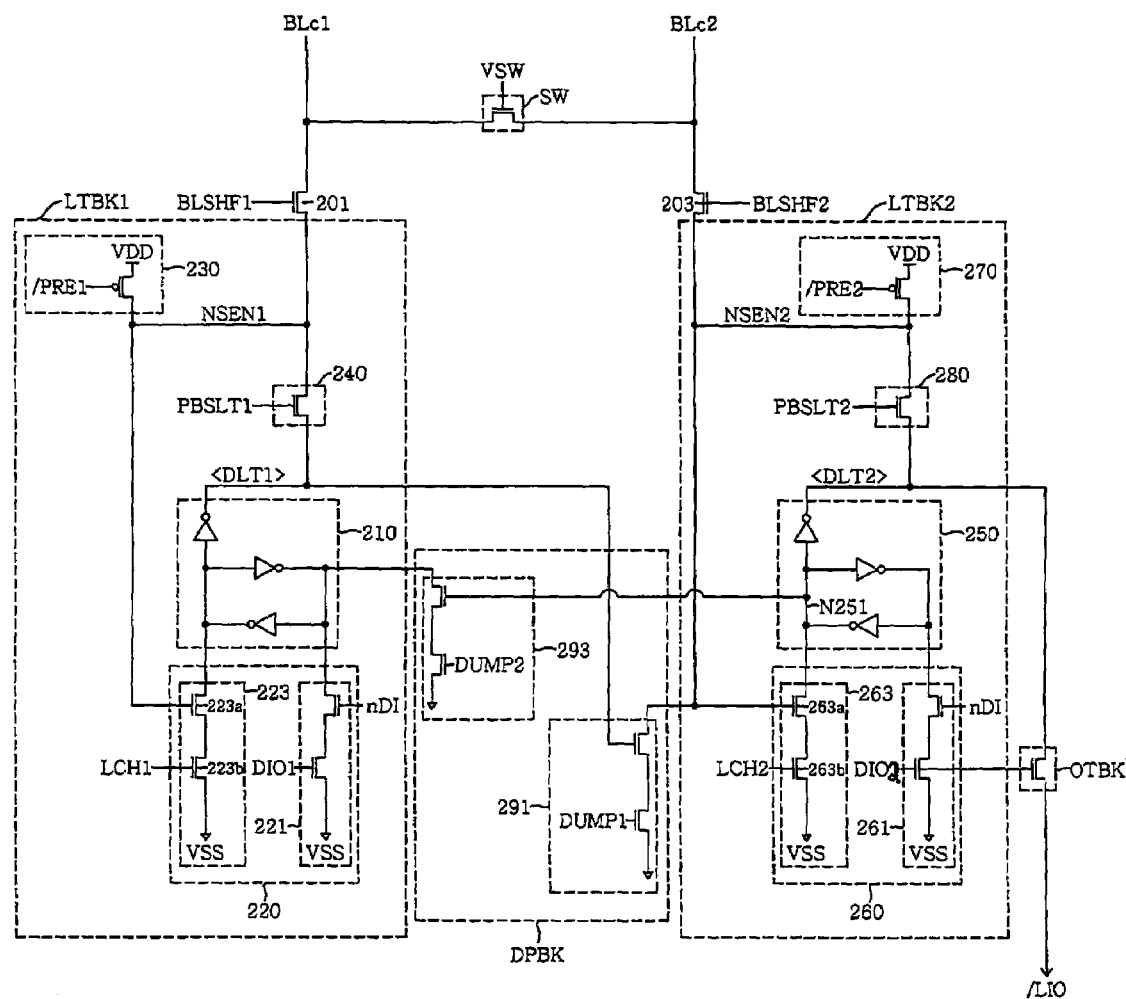
FIG. 7 is a circuit diagram showing the page buffer of FIG. 5 in detail.

FIG. 7 is a circuit diagram illustrating the page buffer 200 of FIG. 5 in detail. Referring to FIG. 7, the page buffer 200 includes a switch SW, a first latch block LTBK1 and a second latch block LTBK2, a dumping block DPBK, and an output block OTBK.

The switch SW connects the first common bit line BLc1 to the second common bit line BLc2 in response to a switching signal VSW. The switch SW is operably connected to the first latch block LTBK1. Specifically, the first latch block LTBK1 is connected to the first common bit line BLc1 that also connects to the switch SW.

The first latch block LTBK1 can store first latch data DLT1. To this end, the first latch block LTBK1 may include a number of components. For example, the first latch block LTBK1 includes a first sensing node NSEN1, a first latch unit 210, a first latch control unit 220, a first precharge unit 230 and a first buffer selection unit 240.

The first sensing node NSEN1 is connected to the first common bit line BLc1 in response to a first bit line connection signal BLSHF1. In this case, data on the first sensing node NSEN1 can be provided to the first common bit line BLc1.

The first latch unit 210 latches and stores first latch data DLT1. Furthermore, the first latch unit 210 can transmit the first latch data DLT1 to the first common bit line BLc1 in response to a first buffer selection signal PBSLT1.

The first latch control unit 220 resets the first latch data DLT1 to a logic L state. In addition, the first latch control unit 220 may flip the first latch data DLT1 to a logic H state from a logic L state based on the voltage level of the first sensing node NSEN1. To this end, the first latch control unit 220 includes a first reset unit 221 and a first flip unit 223. As shown in FIG. 7, the first reset unit 221 includes a pair of transistors. Similarly, the first flip unit 223 also includes a pair of transistors.

The first reset unit 221 resets the first latch data DLT1 to a logic state "L". In this case, a first output control signal DIO1 and a reverse input signal nDI are activated to a logic state "H".

The first flip unit 223 flips the first latch data DLT1 from "L" to "H" in response to the first latch control signal LCH1, if the voltage level of the first sensing node NSEN1 is near the power voltage VDD.

Beneficially, the first flip unit 223 includes a first sensing transistor 223a and a first latch control transistor 223b which are serially arranged between the ground voltage VSS and the first latch unit 210. Furthermore, the first sensing transistor 223a is gated with the first sensing node NSEN1 and connected to the first latch unit 210. In addition, the first latch control transistor 223b is gated with a first latch control signal LCH1 and provides the source voltage of the ground voltage VSS to the first sensing transistor 223a.

In an exemplary embodiment, the first flip unit 223 may set the first latch data DLT1 to "H". Specifically, after the first sensing node NSEN1 is precharged to the voltage level of the power voltage VDD, the first latch data DLT1 is set to "H" in response to the activation of the first latch control signal LCH1. To this end, the first precharge unit 230 precharges the first sensing node NSEN1 to the power voltage VDD in response to a first sensing precharge signal /PRE1.

The first sensing node NSEN1 connects to the first common bit line BLc1 via a first bit line connection unit 201. In particular, the first bit line connection unit 201 in FIG. 7 controls the electrical connection between the first common bit line BLc1 and the first sensing node NSEN1 in response to a first bit line connection signal BLSHF1.

The second latch block LTBK2 can store second latch data DLT2. In addition, the second latch block LTBK2 is connected to the second common bit line BLc2. The second latch block LTBK2 may include a number of components. These components may include, for example, a second sensing node NSEN2, a second latch unit 250, a second latch control unit 260, a second precharge unit 270 and a second buffer selection unit 280.

The second sensing node NSEN2 is connected to the second common bit line BLc2 in response to a second bit line connection signal BLSHF2. In this case, data on the second sensing node NSEN2 can be provided to the second common bit line BLc2.

The second latch unit 250 latches and stores second latch data DLT2. Furthermore, the second latch unit 250 can transmit the second latch data DLT2 to the second common bit line BLc2 in response to a second buffer selection signal PBSLT2.

The second latch control unit 260 resets the second latch data DLT2 to a logic L state. In addition, the second latch control unit 260 may flip the second latch data DLT2 to a logic H state from a logic L state based on the voltage level of the second sensing node NSEN2. To this end, the second latch control unit 260 includes second reset unit 261 and second flip unit 263.

The second reset unit 261 resets the second latch data DLT2 to a logic state "L". In this case, a second output control signal DIO2 and the reverse input signal nDI are activated to a logic state "H".

The second flip unit 263 flips the second latch data DLT2 from "L" to "H" in response to the second latch control signal LCH2, if the voltage level of the second sensing node NSEN1 is near the power voltage VDD.

Beneficially, the second flip unit 263 includes a second sensing transistor 263a and a second latch control transistor 263b which are serially arranged between the ground voltage VSS and the second latch unit 250. Furthermore, the second sensing transistor 263a is gated with the second sensing node NSEN2 and connected to the second latch unit 250. In addition, the second latch control transistor 263b is gated with a second latch control signal LCH2 and provides the source voltage of the ground voltage VSS to the second sensing transistor 263a.

In an exemplary embodiment, the second flip unit 263 may set the first latch data DLT1 to "H". Specifically, after the second sensing node NSEN2 is precharged to the voltage level of the power voltage VDD, the second latch data DLT2 is set to "H" in response to the activation of the second latch control signal LCH2. To this end, the second precharge unit 270 precharges the second sensing node NSEN2 to the power voltage VDD in response to a second sensing precharge signal /PRE2.

The second sensing node NSEN2 connects to the second common bit line BLc2 via a second bit line connection unit 203. In particular, the second bit line connection unit 203 in FIG. 7 controls the electrical connection between the second common bit line BLc2 and the second sensing node NSEN2 in response to the second bit line connection signal BLSHF2.

Referring to FIG. 7, as mentioned above, the page buffer 200 also includes the dumping block DPBK. The dumping block DPBK may be used to perform a number of functions. For example, the dumping block DPBK is operated to control the voltage level of the second sensing node NSEN2 according to the first latch data DLT1. In addition, the dumping block DPBK is operated to flip data in the node N251 of the second latch unit 250 according to the voltage level of the second sensing node NSEN2.

The dumping block DPBK may include a number of components. For example, the dumping block DPBK includes the first dumping unit 291 and the second dumping unit 293. The first dumping unit 291 discharges the first sensing node NSEN1 to the ground voltage VSS in response to the first latch data DLT1. In detail, the first dumping unit 291 discharges the first sensing node NSEN1 to the ground voltage VSS in response to a first dumping signal DUMP1 when the first latch data DLT1 is in a logic H state.

The second dumping unit may be configured to change the state of the first latch data DLT1. Specifically, the second dumping unit 293 reverse flips the first latch data DLT1 from "H" to "L" when the node N251 of the second latch unit 250 is "H". In this case, data in the node N251 of the second latch unit 250 may be controlled by the voltage level of the second sensing node NSEN2. Therefore, the second dumping unit 293 may operate to flip the first latch data DLT1 according to voltage level of the second sensing node NSEN2.

Still referring to FIG. 7, the output block OTBK may occasionally provide the second latch data DLT2 latched in the second latch unit 250 to an internal data line /IDL in response to a second output control signal DIO2.

Referring to FIG. 5 again, the row decoder 300 is coupled to the memory array 100. The row decoder 300 may perform a variety of functions. For example, the row decoder 300 controls the voltage level of a selected word line WL and generates lower and upper string selection signals SSLD and SSLU, and lower and upper ground selection signals GSLD and GSLU.

In addition, as mentioned before, the data input and output circuit 400 outputs data latched by the page buffer 200 to an external system, and loads data input from an external system to the page buffer 200.

In an exemplary embodiment, it is assumed that the data value on the internal data line /IDL is reverse to each of the first to third bits BIT1 to BIT3, provided to the outside of the semiconductor memory device, during programming and read operations. That is, it is assumed that if the data of each bit is "1", the logic state of the internal data line /IDL is L, whereas if the data of each bit is "0", the logic state of the internal data line /IDL is H.

Next, a programming method for the non-volatile semiconductor memory device according to an exemplary disclosed embodiment is described. In this case, the programming of a pair of memory cells is performed in the sequence of first to third page programming operations respectively using first to third bits BIT1 to BIT3.

Figure 8:
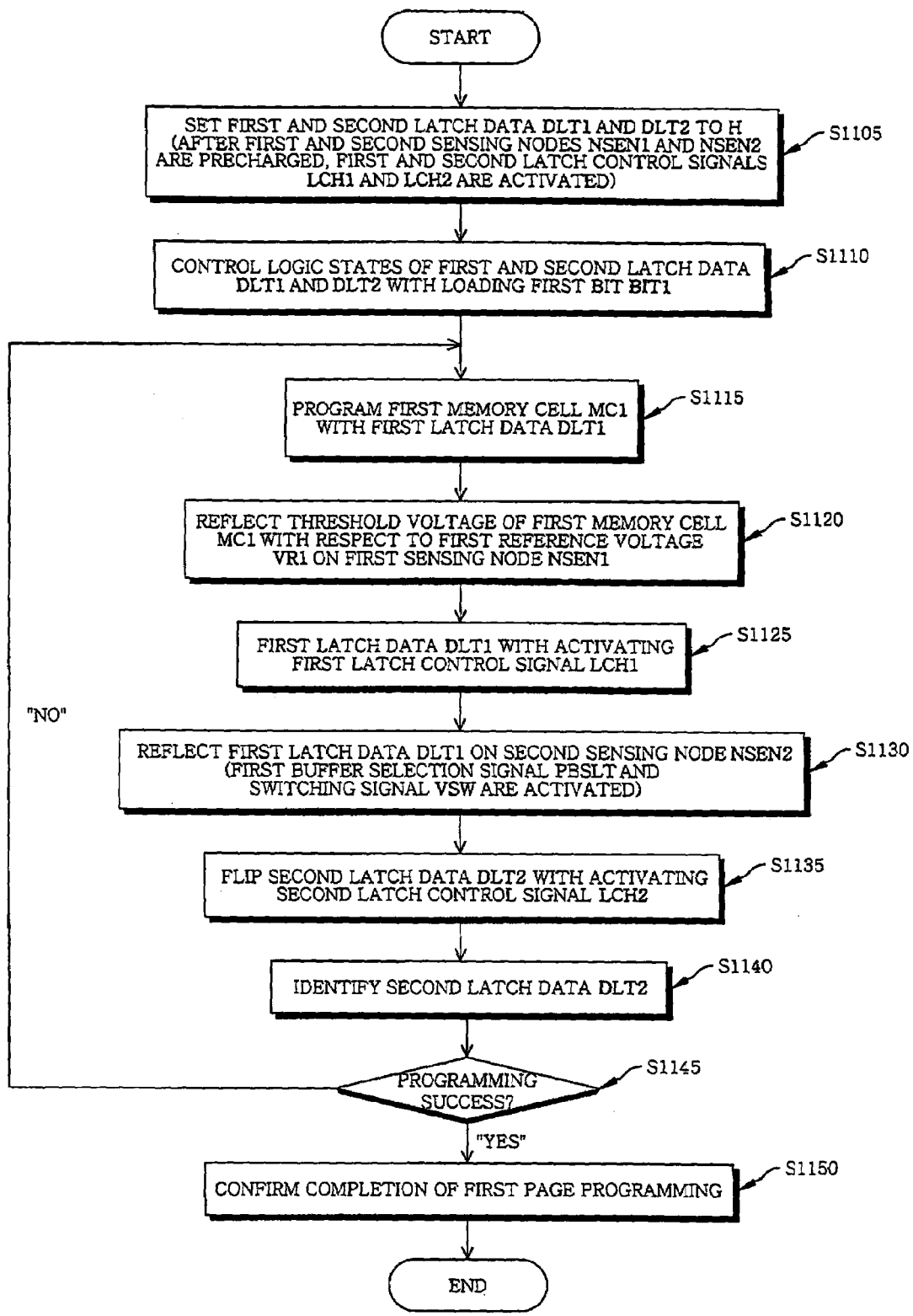
FIGS. 8 and 9 are a flowchart and a data flow diagram, respectively, showing a first page programming step in a programming method for an exemplary disclosed non-volatile semiconductor memory device of the present invention.
Figure 9:
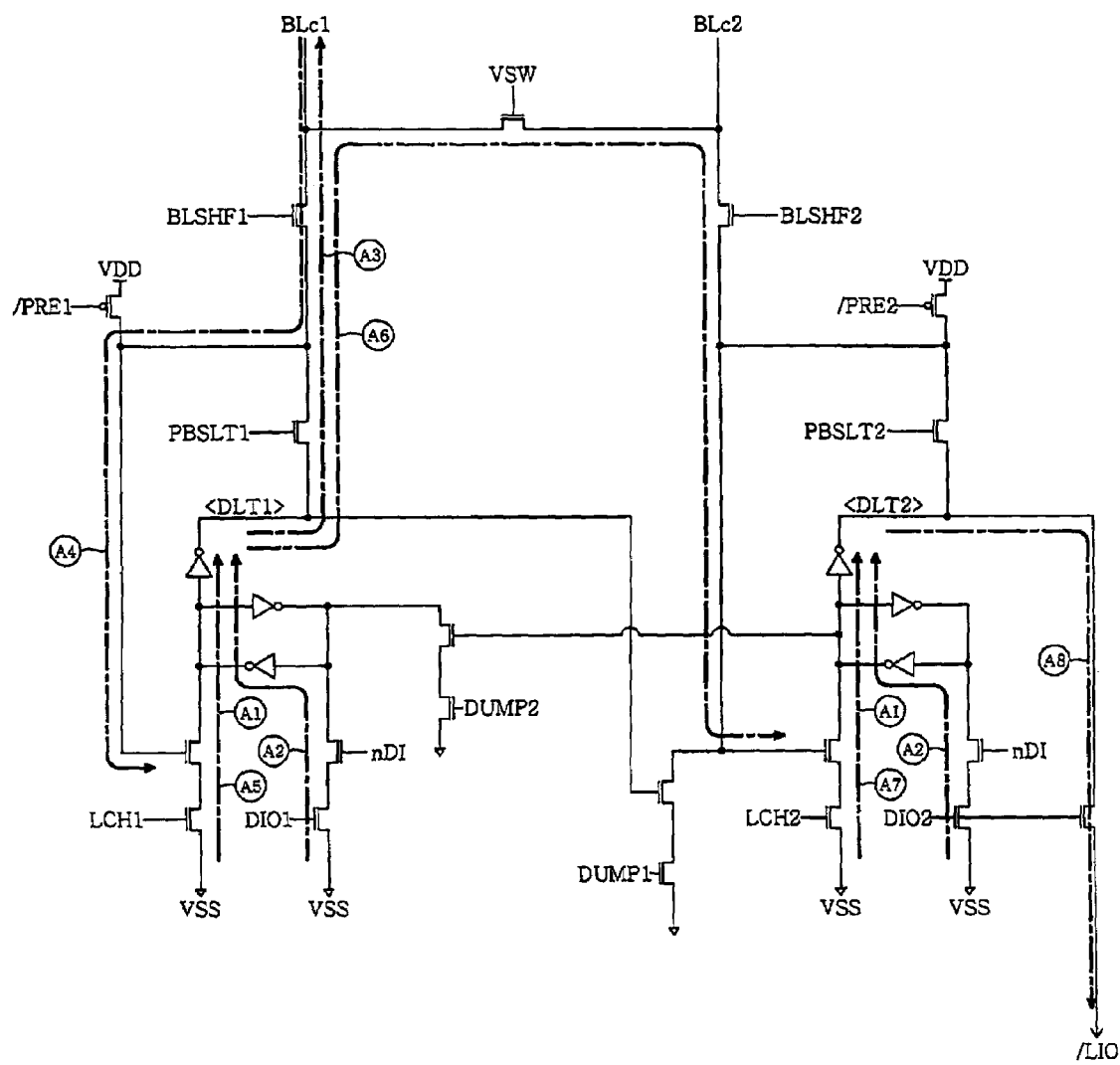

FIGS. 8 and 9 are a flowchart and a data flow diagram, respectively, showing a first page programming step in a programming method for an exemplary embodiment of the non-volatile semiconductor memory device. At the first page programming step, the threshold voltage of the first memory cell MC1 is programmed with a second threshold voltage group G2, depending on the data of the first bit BIT1.

Referring to FIG. 8, at step S1105, after the first and the second sensing nodes NSEN1 and NSEN2 are pre-charged to the power voltage VDD, the first and the second latch control signals LCH1 and LCH2 are activated to logic "H". Furthermore, the first latch data DLT1 and the second latch data DLT2 are set to a logic H state. (refer to A1 of FIG. 9).

At step S1110, the data of the first bit BIT1 is loaded as the first latch data DLT1 and the second latch data DLT2 (refer to A2 of FIG. 9). That is, when the first bit BIT1 is "0", an inverted input signal nDI, the first output control signal DIO1, and the second output control signal DIO2 are activated to a logic H state. The setting of these signals to a logic H state causes the first latch data DLT1 and the second latch data DLT2 to latch as a logic L state. In contrast, when the first bit BIT1 is "1", the first latch data DLT1 and the second latch data DLT2 are maintained in a logic H state.

Thereafter, at step S1115, the first latch data DLT1 is dumped to a first common bit line BLc1. This transfer of the first latch data DLT1 to the common bit line BLc1 programs the first memory cell MC1 (refer to A3 of FIG. 9). That is, when the first bit BIT1 is "0", the threshold voltage of the first memory cell MC1 is increased, whereas, when the first bit BIT1 is "1", the threshold voltage of the first memory cell MC1 is maintained in its previous state.

Furthermore, at step S1120, the threshold voltage of the first memory cell MC1 with respect to the first reference voltage VR1 is reflected on the first sensing node NSEN1. This showing of the threshold voltage of the cell MC1 on the first sensing node NSEN1 is achieved through the first common bit line BLc1 (refer to A4 of FIG. 9). That is, whether the threshold voltage of the first memory cell MC1 is equal to or higher than the first reference voltage VR1 is reflected on the first sensing node NSEN1 through the first common bit line BLc1. In other words, if the threshold voltage of the first memory cell MC1 is higher than the first reference voltage VR1, the voltage levels of the first common bit line BLc1 and the first sensing node NSEN1 are controlled to the supply voltage VDD. In contrast, if the threshold voltage of the first memory cell MC1 is lower than the first reference voltage VR1, the voltage levels of the first common bit line BLc1 and the first sensing node NSEN1 are controlled to the ground voltage VSS.

At step S1125, the first latch control signal LCH1 is generated as an H pulse. In this case, the first latch data DLT1 is selectively flipped from a logic L state to a logic H state depending on the voltage level of the first sensing node NSEN1 (refer to A5 of FIG. 9). In other words, when the voltage level of the first sensing node NSEN1 is close to the supply voltage VDD, the first latch data DLT1 is flipped from a logic L state to a logic H state. In contrast, when the voltage level of the first sensing node NSEN1 is close to the ground voltage VSS, the first latch data DLT1 is maintained in its previous state.

Consequently, the fact that the first latch data DLT1 is in a logic L state after step S1125 has been performed means that the first memory cell MC1 has been programmed, but the threshold voltage of the first memory cell MC1 has not been controlled to the second threshold voltage group G2 as a target.

At step S1130, the first latch data DLT1 is reflected on the second sensing node NSEN2 (refer to A6 of FIG. 9). In this case, the first buffer selection signal PBSLT1 and the switching signal VSW are activated to a logic H state.

At step S1135, the second latch control signal LCH2 is generated as an H pulse. In this case, the second latch data DLT2 is selectively flipped from a logic L state to a logic H state depending on the voltage level of the second sensing node NSEN2 (refer to A7 of FIG. 9).

At step S1140, the second output control signal DIO2 is generated as an H pulse and the logic state of the second latch data DLT2 is read and provided to the outside of the semiconductor memory device (refer to A8 of FIG. 9). At step S1145, a programming success or failure is determined. In an exemplary embodiment, the logic H state of the data that is read at step S1140, indicates a programming success. In contrast, the logic L state of the data that is read at step S1140 indicates a programming failure.

If a programming failure has been determined, steps beginning from step S1115 are repeated. In this case, at step S1115, the voltage level of a selected word line is gradually increased.

If a programming success has been determined at step S1145, the completion of the first page programming is confirmed at step S1140.

Figure 10:
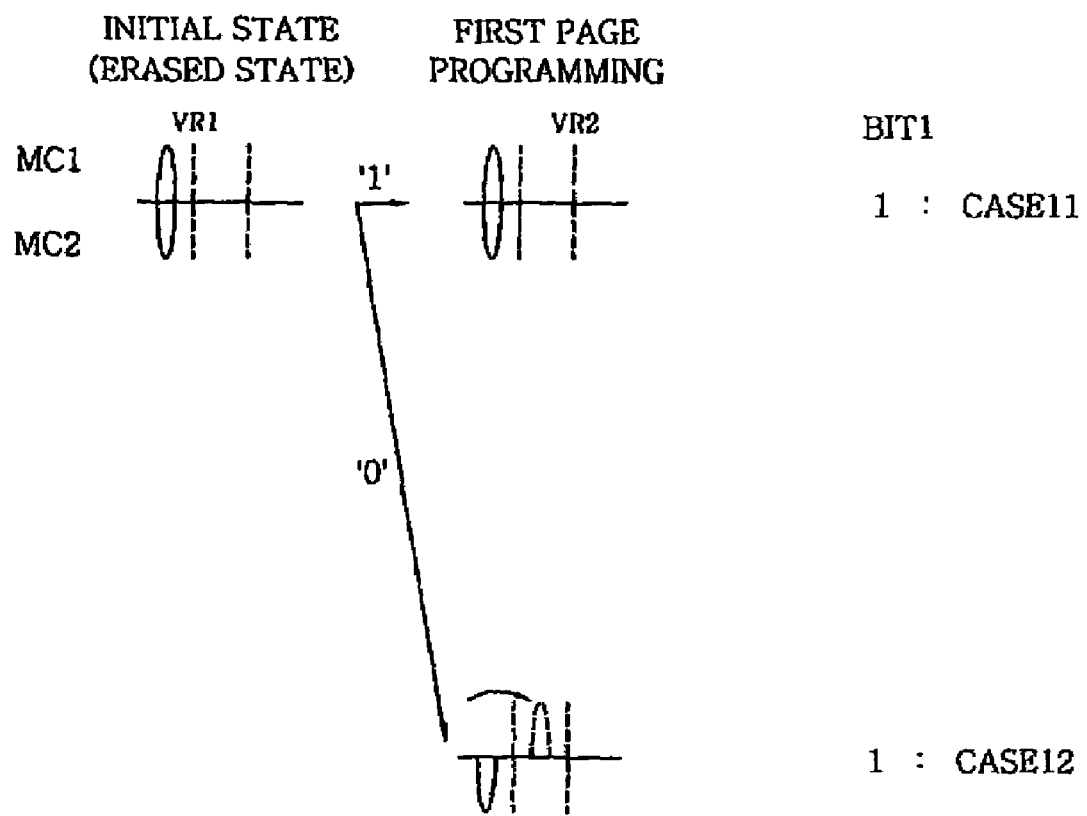
FIG. 10 is a diagram showing variation in the threshold voltage of first and second memory cells after the first page programming step has been performed in a programming method for an exemplary disclosed non-volatile semiconductor memory device of the present invention.

FIG. 10 is a diagram illustrating variations in the threshold voltages of first and second memory cells MC1 and MC2 after the first page programming step has been performed in the programming method for the exemplary non-volatile semiconductor memory device. When the data of the first bit BIT1 is "1" (CASE11), both the threshold voltages of the first and the second memory cells MC1 and MC2 are maintained in an erased state, that is, a first threshold voltage group G1. On the other hand, when the data of the first bit BIT1 is "0" (CASE12), the threshold voltage of the first memory cell MC1 is controlled to the second threshold voltage group G2, and the threshold voltage of the second memory cell MC2 is maintained at the first threshold voltage group G1.

Figure 11:
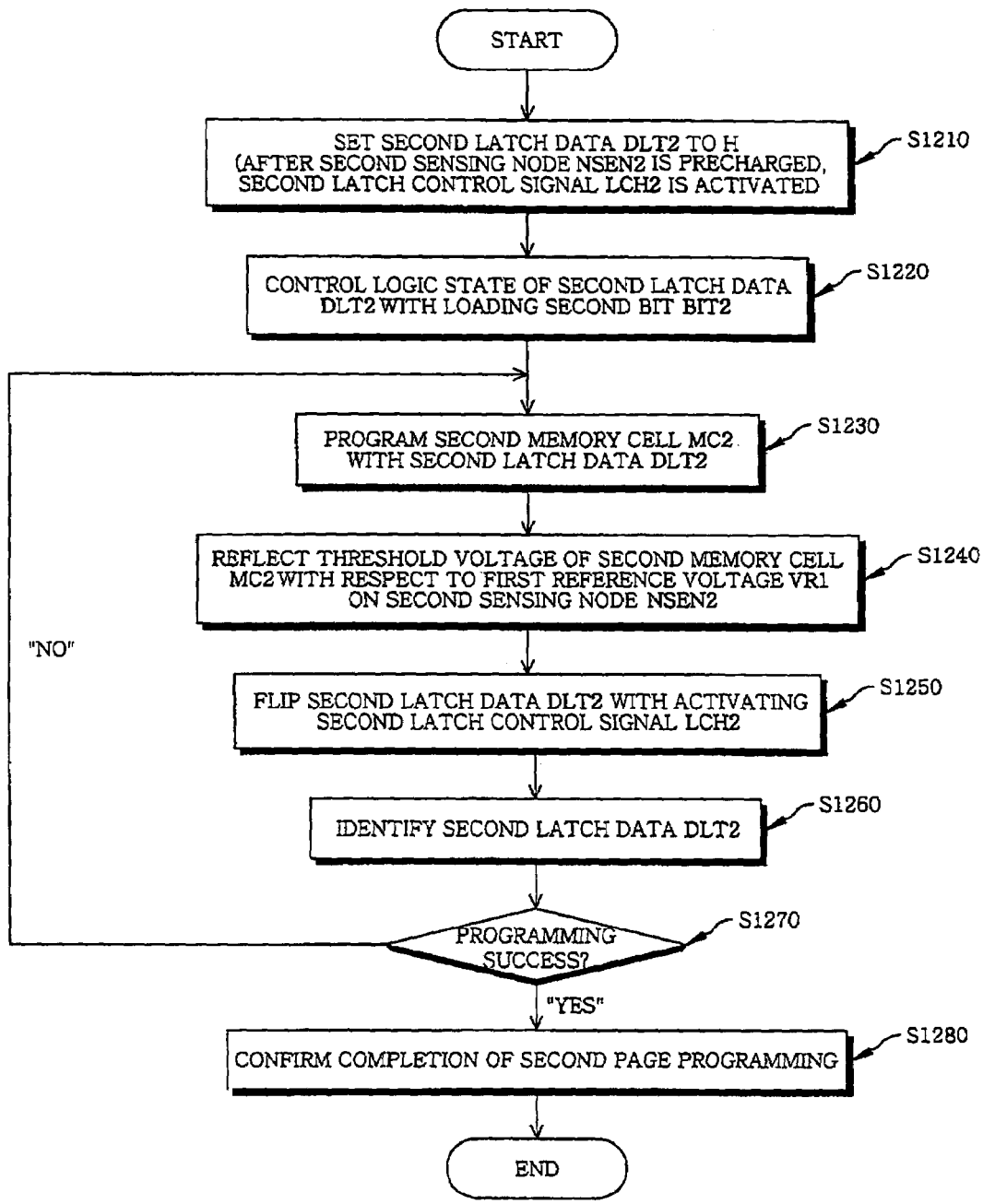
FIGS. 11 and 12 are a flowchart and a data flow diagram, respectively, showing a second page programming step in a programming method for an exemplary disclosed non-volatile semiconductor memory device of the present invention.
Figure 12:
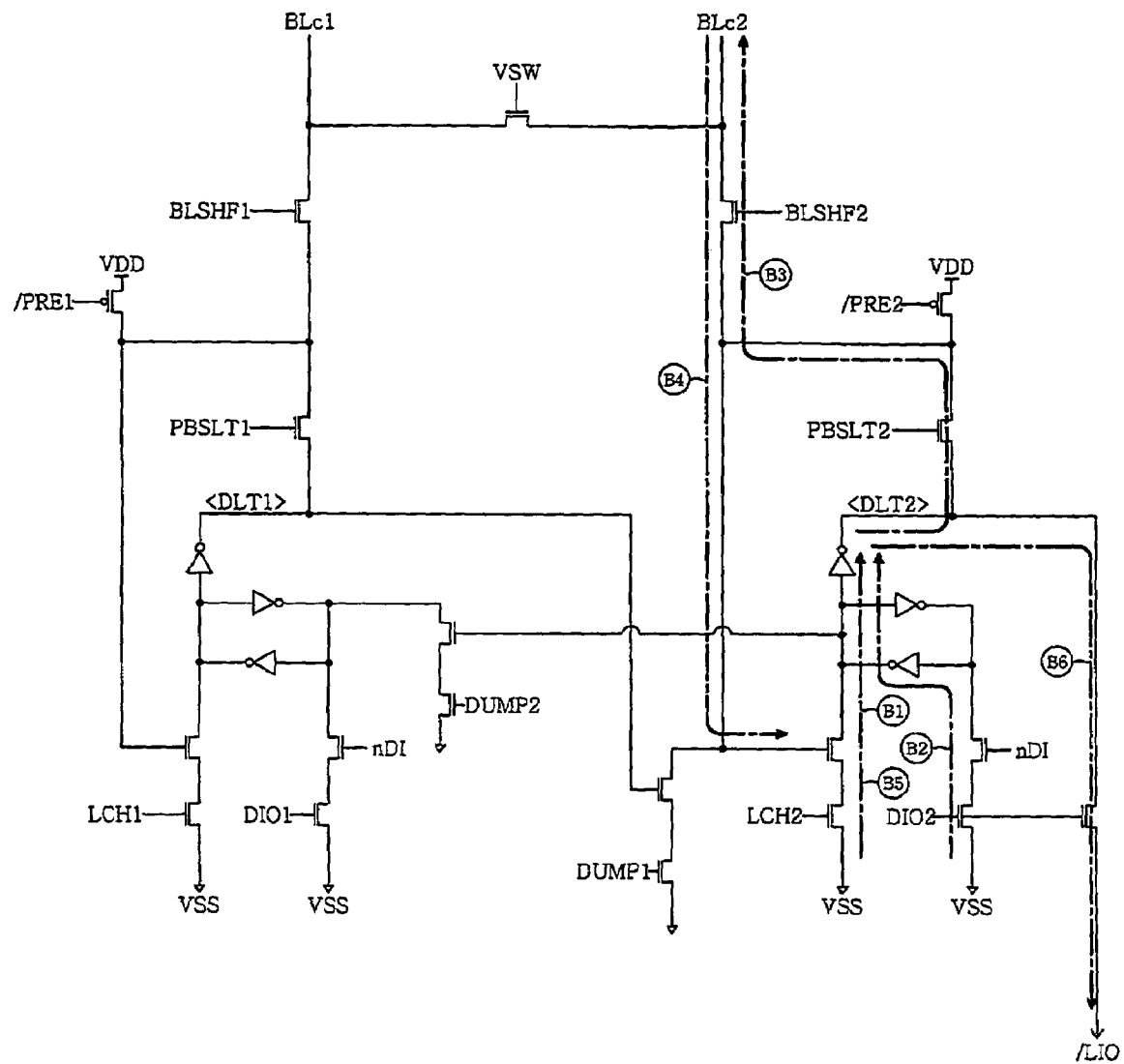

FIGS. 11 and 12 are a flowchart and a data flow diagram illustrating a second page programming step in the programming method for an exemplary disclosed embodiment of a non-volatile semiconductor memory device. At the second page programming step, the threshold voltage of the second memory cell MC2 is programmed with the second threshold voltage group G2 depending on the data of the second bit BIT2.

Referring to FIG. 11, at step S1210, after the second sensing nodes NSEN2 is precharged to the power voltage VDD, the second latch control signal LCH2 is activated to logic "H". In addition, the second latch data DLT2 is set to a logic H state. (refer to B1 of FIG. 12).

Furthermore, at step S1220, the data of the second bit BIT2 is loaded as the second latch data DLT2 (refer to B2 of FIG. 12). That is, when the second bit BIT2 is "0", the inverted input signal nDI and the second output control signal DIO2 are activated to a logic H state, so that the second latch data DLT2 is latched as a logic L state. In contrast, when the second bit BIT2 is "1", the input signal DI is activated to a logic H state and the second latch data DLT2 is maintained in a logic H state.

Thereafter, at step S1230, the second latch data DLT2 is dumped to the second common bit line BLc2. This dumping of the second latch data DLT1 to the second common bit line BLc2 programs the second memory cell MC2 (refer to B3 of FIG. 12). That is, if the second bit BIT2 is "0", the threshold voltage of the second memory cell MC2 is increased, whereas if the second bit BIT2 is "1", the threshold voltage of the second memory cell MC2 is maintained in its previous state.

Furthermore, at step S1240, the threshold voltage of the second memory cell MC2 with respect to the first reference voltage VR1 is reflected on the second sensing node NSEN2. This may be achieved through the second common bit line BLc2 (refer to B4 of FIG. 12). That is, whether the threshold voltage of the second memory cell MC2 is equal to or higher than the first reference voltage VR1 is reflected on the second sensing node NSEN2 through the second common bit line BLc2. In other words, when the threshold voltage of the second memory cell MC2 is higher than the first reference voltage VR1, the voltage levels of the second common bit line BLC2 and the second sensing node NSEN2 are controlled to the supply voltage VDD. In contrast, if the threshold voltage of the second memory cell MC2 is lower than the first reference voltage VR1, the voltage levels of the second common bit line BLc2 and the second sensing node NSEN2 are controlled to the ground voltage VSS.

At step S1250, a second latch control signal LCH2 is generated as an H pulse. In this case, the second latch data DLT2 is selectively flipped from a logic L state to a logic H state depending on the voltage level of the second sensing node NSEN2 (refer to B5 of FIG. 12). In other words, if the voltage level of the second sensing node NSEN2 is close to the supply voltage VDD, the second latch data DLT2 is flipped from a logic L state to a logic H state. In contrast, if the voltage level of the second sensing node NSEN2 is close to the ground voltage VSS, the second latch data DLT2 is maintained in its previous data state.

Consequently, the fact that the second latch data DLT2 is in a logic L state after step S1250 has been performed means that the second memory cell MC2 has been programmed. However, the threshold voltage of the second memory cell MC2 has not been controlled to the second threshold voltage group G2 as a target.

At step S1260, a second output control signal DIO2 is generated as an H pulse, so that the logic state of the second latch data DLT2 is read and provided to the outside of the semiconductor memory device (refer to B6 of FIG. 12). At step S1270, a programming success or failure is determined. In an exemplary embodiment, the logic H state of the data that is read at step S1260 indicates a programming success, whereas the logic L state of the data read at step S1260 indicates a programming failure.

If a programming failure has been determined, steps beginning from step S1230 are repeated. In this case, at step S1230, the voltage level of a selected word line is gradually increased. On the other hand, if a programming success has been determined at step S1270, the completion of the second page programming is confirmed at step S1280.

Figure 13:
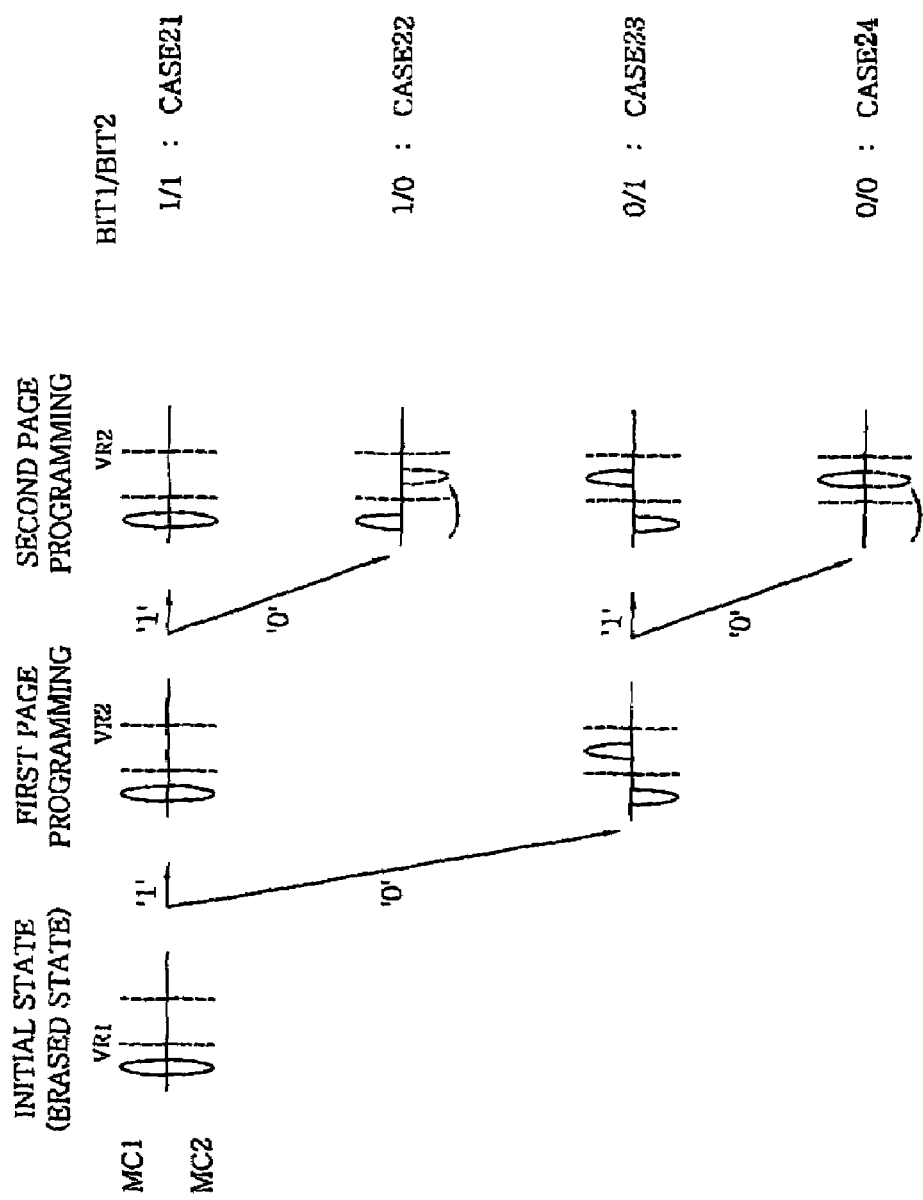
FIG. 13 is a diagram showing variation in the threshold voltages of first and second memory cells after a second page programming step has been performed in a programming method for an exemplary disclosed non-volatile semiconductor memory device of the present invention.

FIG. 13 is a diagram showing variations in the threshold voltages of the first and the second memory cells MC1 and MC2 after the second page programming step has been performed in the programming method for the exemplary disclosed non-volatile semiconductor memory device.

When both the first and the second bits BIT1 and BIT2 are "1" (CASE21), the threshold voltages of the first and the second memory cells MC1 and MC2 are maintained in an erased state, that is, the first threshold voltage group G1.

When the data of the first bit BIT1 is "1", and the data of the second bit BIT2 is "0" (CASE22), the threshold voltage of the first memory cell MC1 is maintained at the first threshold voltage group G1, and the threshold voltage of the second memory cell MC2 is controlled to the second threshold voltage group G2.

When the data of the first bit BIT1 is "0" and the data of the second bit BIT2 is "1" (CASE23), the threshold voltage of the first memory cell MC1 is maintained at the second threshold voltage group G2, and the threshold voltage of the second memory cell MC2 is maintained at the first threshold voltage group G1.

When both the first and the second bits BIT1 and BIT2 are "0" (CASE24), the threshold voltage of the first memory cell MC1 is maintained at the second threshold voltage group G2, and the threshold voltage of the second memory cell MC2 is controlled to the second threshold voltage group G2.

Figure 14A:
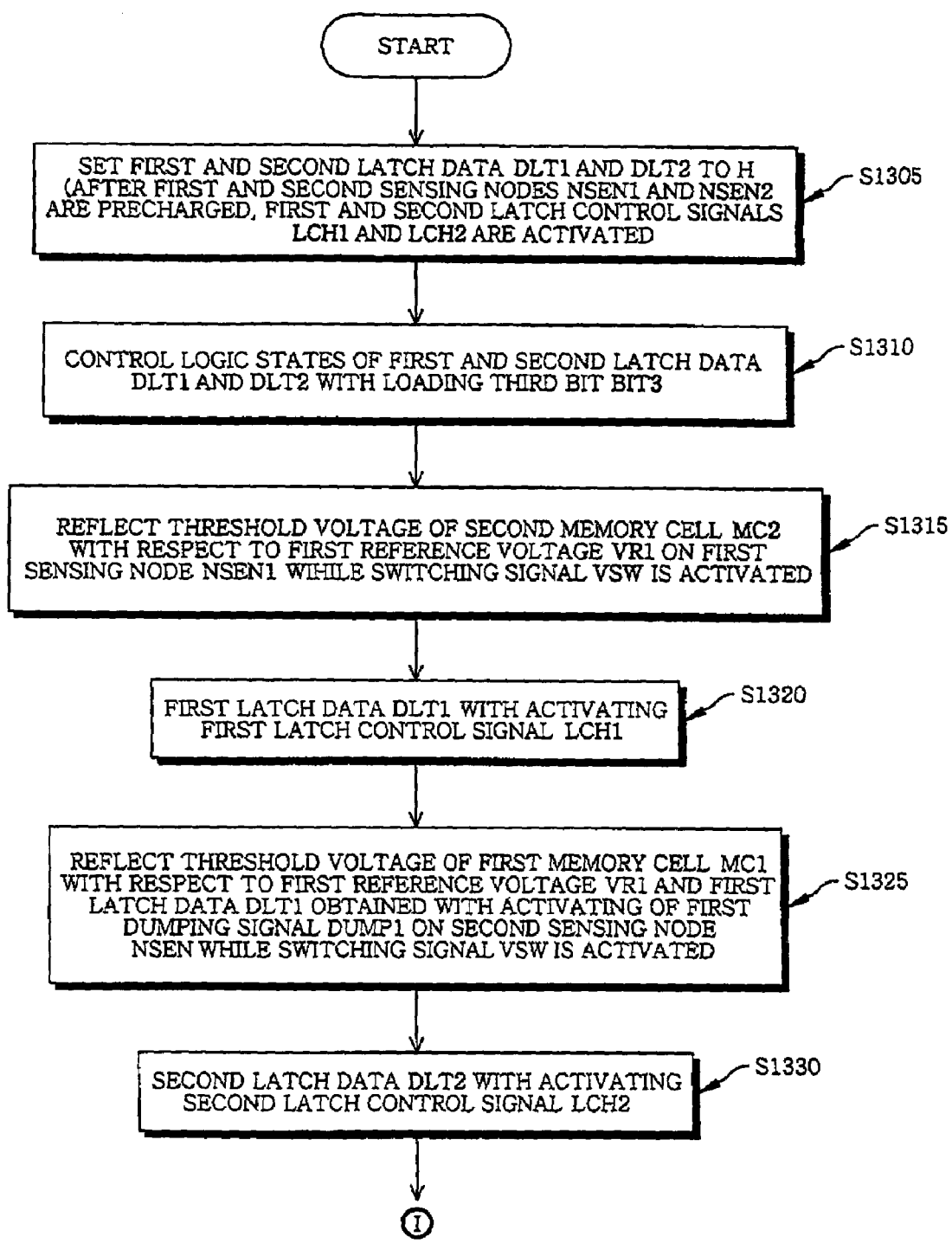
FIGS. 14A and 14B are flowcharts showing a third page programming step in a programming method for an exemplary disclosed non-volatile semiconductor memory device of the present invention.
Figure 14B:
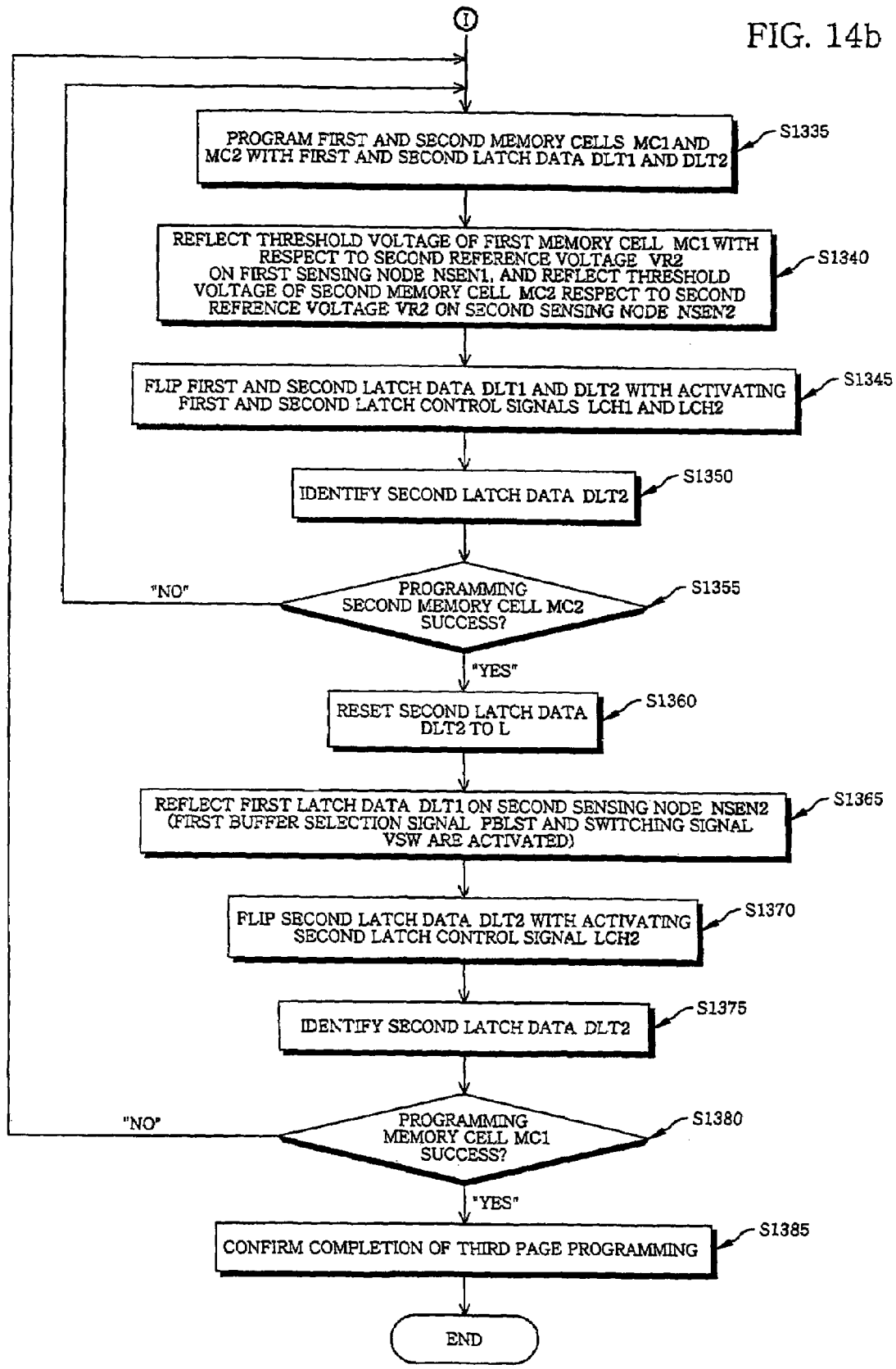
Figure 15A:
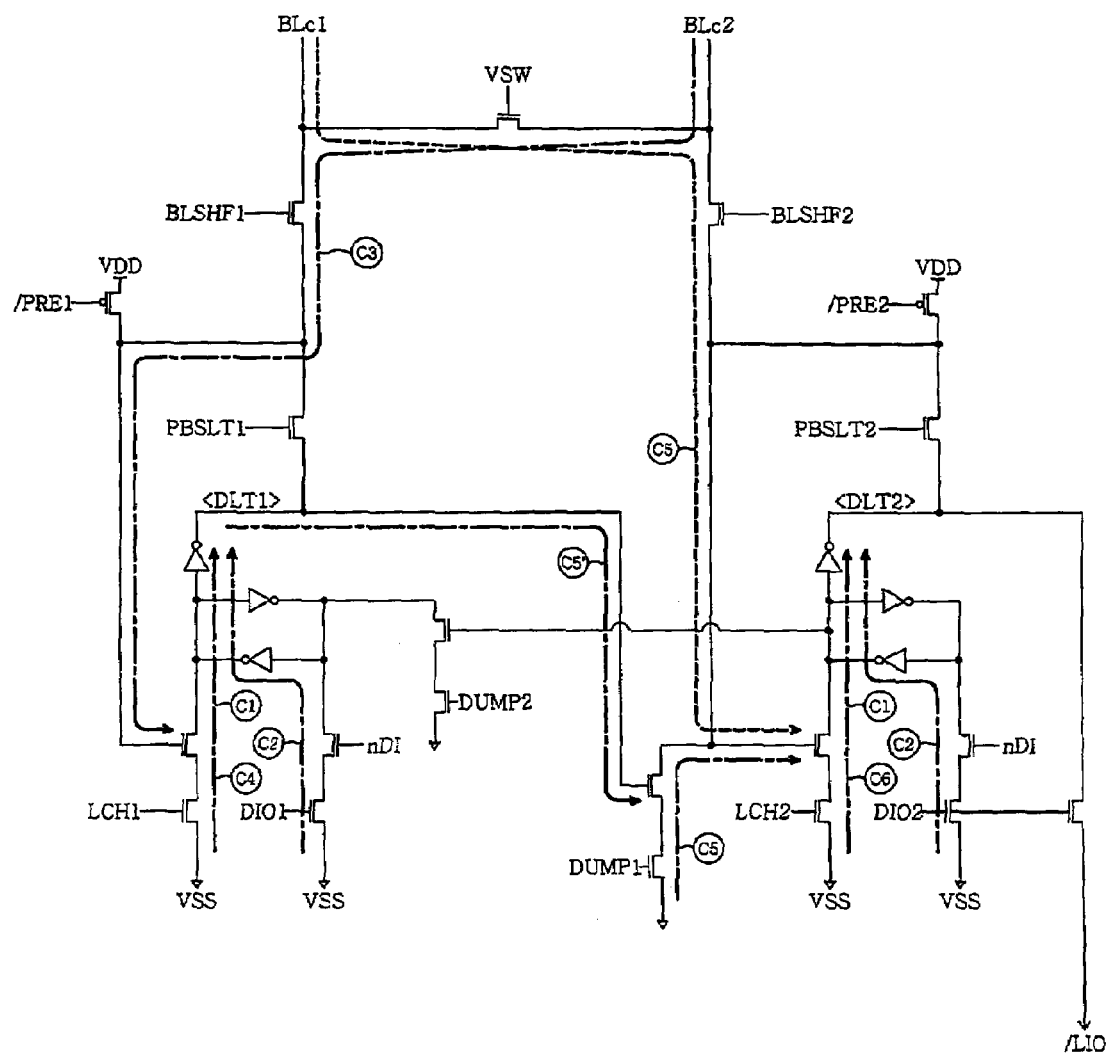
FIGS. 15A and 15B are data flow diagrams based on the flowcharts of FIGS. 14A and 14B.
Figure 15B:
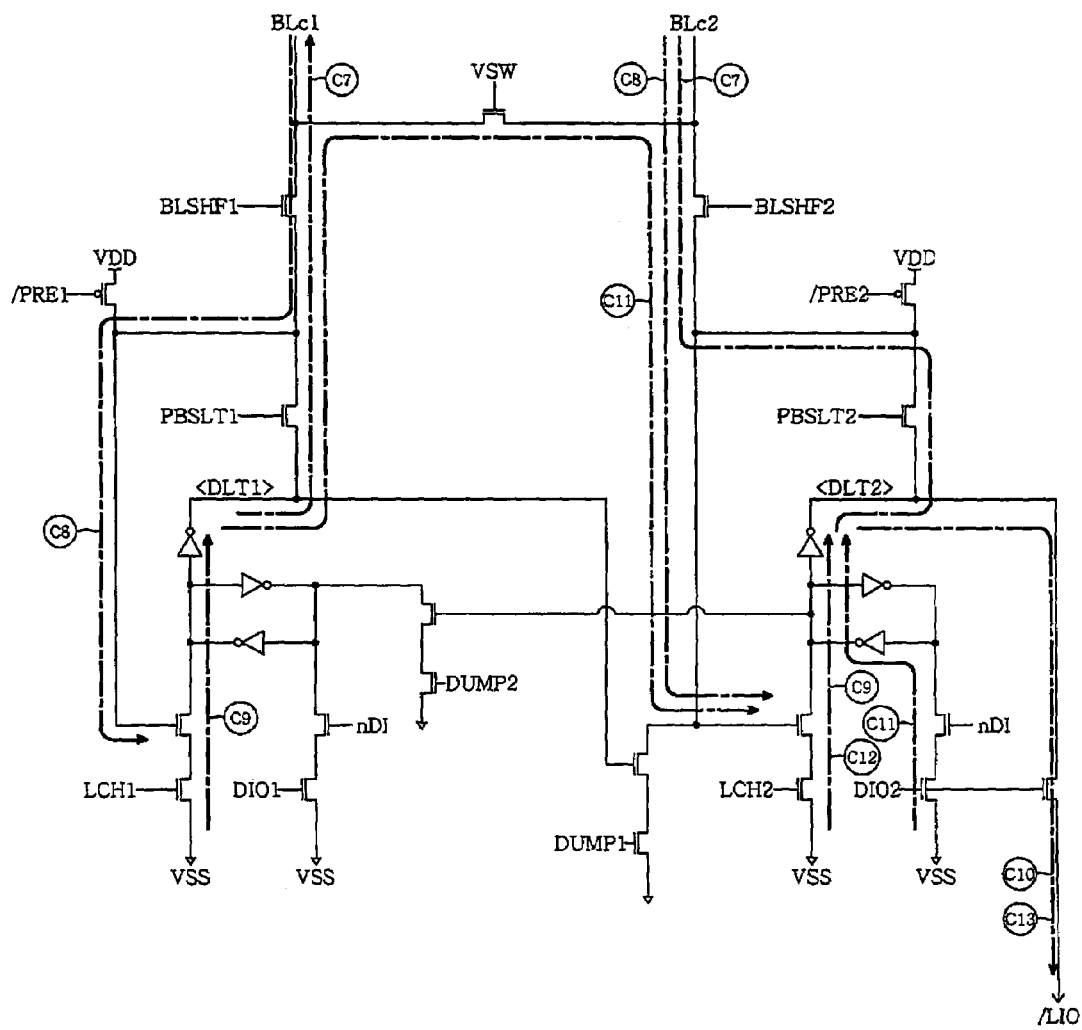

FIGS. 14A and 14B are flowcharts showing a third page programming step in the programming method for the exemplary disclosed non-volatile semiconductor memory device. Furthermore, FIGS. 15A and 15B are data flow diagrams based on the flowcharts of FIGS. 14A and 14B. In particular, at the third page programming step, the threshold voltages of the first memory cell MC1 and/or the second memory cell MC2 are programmed with the third threshold voltage group G3 depending on the data of the third bit BIT3.

Referring to FIGS. 14A and 14B, at step S1305, after the first and the second sensing nodes NSEN1 and NSEN2 are pre-charged to the power voltage VDD, the first and the second latch control signals LCH1 and LCH2 are activated to logic "H". In addition, the first latch data DLT1 and the second latch data DLT2 are set to a logic H state. (refer to C1 of FIG. 15A).

At step S1310, the data of the third bit BIT3 is loaded as the first latch data DLT1 and the second latch data DLT2 (refer to C2 of FIG. 15A). That is, when the third bit BIT3 is "0", the inverted input signal nDI, the first output control signal DIO1, and the second output control signal DIO2 are activated to a logic H state, so that the first latch data DLT1 and the second latch data DLT2 are latched at a logic L state. In contrast, when the third bit BIT3 is "1", the input signal DI is activated to a logic H state, and the first latch data DLT1 and the second latch data DLT2 are maintained in a logic H state.

Thereafter, at steps S1315 and S1320, the previous data reflection step of flipping the first latch data DLT1 that is loaded at the data loading step, is performed using the data of the second memory cell MC2 that is programmed at the second page programming step.

In detail, at step S1315, the data of the second memory cell MC2 that is programmed at the second page programming step is reflected on the first sensing node NSEN1 with respect to the first reference voltage VR1 (refer to C3 of FIG. 15A). In this case, a switching signal VSW is activated to a logic H state so that the second common bit line BLc2 is connected to the first common bit line BLc1.

Furthermore, at step S1320, the first latch data DLT1 that is loaded at step S1310 is controlled using the voltage level of the first sensing node NSEN1 obtained at step S1315 (refer to C4 of FIG. 15A).

Consequently, even if the third bit BIT3 is "0", the first latch data DLT1 is flipped from a logic L state to a logic H state when the second bit BIT2 is "0". Furthermore, when the third bit BIT3 is "1", the first latch data DLT1 is maintained at a logic H state. In contrast, when the second bit BIT2 is "1" and the third bit BIT3 is "0", the first latch data DLT1 is maintained at a logic L state.

Thereafter, at steps S1325 and S1330, the step of flipping the second latch data DLT2 that is loaded at the data loading step is performed. This step is performed using the data of the first memory cell MC1. The data in the first memory cell MC1 that is used for this procedure is the data programmed at the first page programming step. In addition, the first latch data DLT1 that is flipped at step S1320 is also used to flip the second latch data DLT2.

In detail, at step S1325, the threshold voltage of the first memory cell MC1 with respect to the first reference voltage VR1 and the first latch data DLT1 is reflected on the second sensing node NSEN2 (refer to C5 and C5' of FIG. 15A). In this case, the switching signal VSW is activated to a logic H state so that the first common bit line BLc1 is connected to the second common bit line BLc2. In addition, the first dumping signal DUMP1 is activated to a logic H state.

Furthermore, at step S1330, the second latch data DLT2, loaded at step S1310, is controlled using the voltage level of the second sensing node NSEN2 obtained at step S1325 (refer to C6 of FIG. 15A). In this case, the input signal DI is activated to a logic H state.

Consequently, even if the third bit BIT3 is "0", the second latch data DLT2 is flipped from a logic L state to a logic H state when the first latch data DLT1 is in a logic L state and the first bit BIT1 is "0".

After step S1330 has been performed, the logic states of the first latch data DLT1 and the second latch data DLT2 are shown in FIG. 16.

FIG. 16 illustrates the results of reading the third bit BIT3. Specifically, CASE31 to CASE34 show the cases where BIT3 is "0". Furthermore, CASE35 shows the case where BIT3 is When the first and the second bits BIT1 and BIT2 are "1" (CASE31), both the first latch data DLT1 and the second latch data DLT2 are maintained in a logic L state. However, when the first bit BIT1 is "1" and the second bit BIT2 is "0" (CASE32), the first latch data DLT1 is flipped to a logic H state and the second latch data DLT2 is maintained in a logic L state.

When the first bit BIT1 is "0", and the second bit BIT2 is "1" (CASE33), the first latch data DLT1 is maintained in a logic L state and the second latch data DLT2 is flipped to a logic H state. However, when the first and the second bits BIT1 and BIT2 are "0" (CASE34), the first latch data DLT1 is flipped to a logic H state, and the second latch data DLT2 is maintained in a logic L state.

Furthermore, when the third bit BIT3 is "1" (CASE35), both of the first latch data DLT1 and the second latch data DLT2 are maintained in a logic H state regardless of the first and the second bits BIT1 and BIT2.

Referring to FIG. 14b, thereafter, at step S1335, the programming step of programming the first and the second memory cells MC1 and MC2 is performed using the first and the second latch data DLT1 and DLT2 flipped at steps S1320 and step S1330 (refer to C7 of FIG. 15B). That is, when the third bit BIT3 is "1", the threshold voltage of the first memory cell MC1 is maintained in its previous state. In contrast, when the third bit BIT3 is "0", the threshold voltage of the first or second memory cell MC1 or MC2 is controlled to the third threshold voltage group G3.

Next, at step S1340, the threshold voltage of the first memory cell MC1 with respect to the second reference voltage VR2 is reflected on the first sensing node NSEN1. Specifically, the threshold voltage of the first memory cell MC1 is reflected on NSEN1 through the first common bit line BLc1. Similarly, the threshold voltage of the second memory cell MC2 with respect to the second reference voltage VR2 is reflected on the second sensing node NSEN2 through the second common bit line BLc1. (refer to C8 of FIG. 15B).

At step S1345, the first and the second latch control signals LCH1 and LCH2 are generated as an H pulse. As a result, the first and the second latch data DLT1 and DLT2 are selectively flipped from a logic L state to a logic H state depending on the voltage level of the first and the second sensing nodes NSEN1 and NSEN2, respectively. (refer to C9 of FIG. 15B)

At step S1350, a second output control signal DIO2 is generated as an H pulse. This generation of the control signal DIO2 as an H pulse causes the logic state of the second latch data DLT2 to be read and provided to the outside of the semiconductor memory device (refer to C10 of FIG. 15B). At step S1355, a programming success or failure is determined.

If a programming failure has been determined, steps starting from step S1335 are repeated. In this case, at step S1335, the voltage level of a selected word line is gradually increased.

If a programming success has been determined, the inverted input signal nDI and the second output control signal DIO2 are activated to a logic state "H", so that the second latch data DLT2 is reset to a logic state "L" (refer to C11 of FIG. 15B).

At step S1365, the first latch data DLT1 is reflected on the second sensing node NSEN2 (refer to C11 of FIG. 15B). In this case, the first buffer selection signal PBSLT1 and the switching signal VSW are activated to a logic H state.

At step S1370, the second latch control signal LCH2 is generated as an H pulse. In this case, the second latch data DLT2 is selectively flipped from a logic L state to a logic H state depending on the voltage level of the second sensing node NSEN2 (refer to C12 of FIG. 15B).

At step S1375, the second output control signal DIO2 is generated as an H pulse. In addition, the logic state of the second latch data DLT2 is read and provided to the outside of the semiconductor memory device (refer to C13 of FIG. 15B). At step S1380, a programming success or failure is determined.

If a programming failure has been determined, steps starting from step S1335 are repeated. In this case, at step S1335, the voltage level of a selected word line is gradually increased.

If a programming success has been determined, the completion of the third page programming is confirmed at step S1385.

Figure 17:
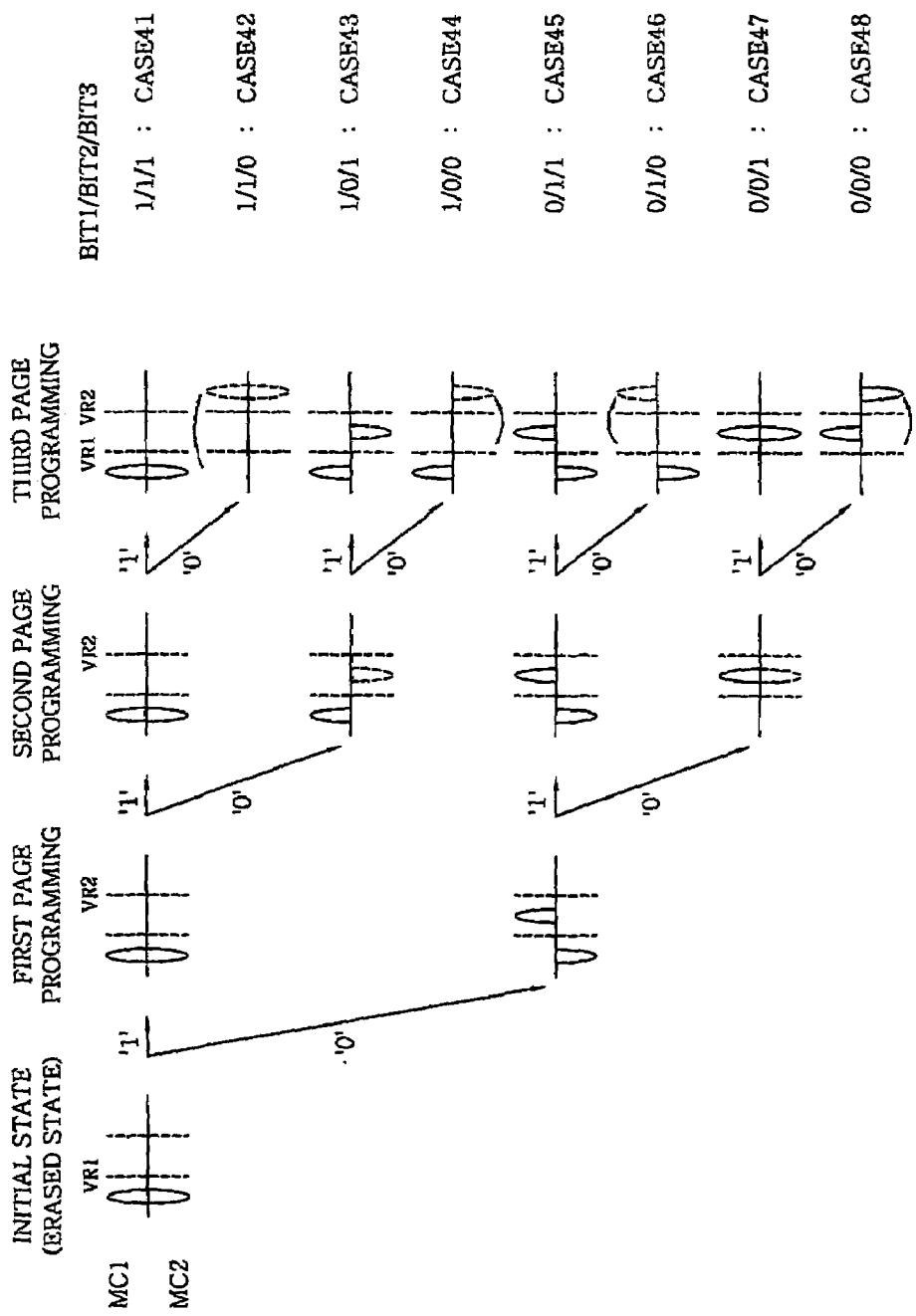
FIG. 17 is a diagram showing variation in the threshold voltages of first and second memory cells after the third page programming step has been performed in the programming method for an exemplary disclosed non-volatile semiconductor memory device of the present invention.

FIG. 17 is a diagram showing the change in the threshold voltages of the first and the second memory cells MC1 and MC2 after the third page programming step has been performed in the programming method for an exemplary disclosed non-volatile semiconductor memory device.

When the first, the second and the third bits BIT1, BIT2 and BIT3 are "1" (CASE41), the threshold voltages of the first and the second memory cells MC1 and MC2 are maintained in an erased state, that is, in the first threshold voltage group G1.

When the data of the first and the second bits BIT1 and BIT2 are "1", and the data of the third bit BIT3 is "0" (CASE42), the threshold voltages of the first and the second memory cells MC1 and MC2 are controlled to an erased state, that is, the third threshold voltage group G3.

When the data of the first bit BIT1 is "1", the data of the second bit BIT2 is "0", and the data of the third bit BIT3 is "1" (CASE43), the threshold voltage of the first memory cell MC1 is maintained at the first threshold voltage group G1, and the threshold voltage of the second memory cell MC2 is maintained at the second threshold voltage group G2.

When the data of the first bit BIT1 is "1", the data of the second bit BIT2 is "0", and the data of the third bit BIT3 is "0" (CASE44), the threshold voltage of the first memory cell MC1 is maintained at the first threshold voltage group G1, and the threshold voltage of the second memory cell MC2 is controlled to the third threshold voltage group G3.

When the data of the first bit BIT1 is "0", the data of the second bit BIT2 is "1" and the data of the third bit BIT3 is "1" (CASE45), the threshold voltage of the first memory cell MC1 is maintained at the second threshold voltage group G2, and the threshold voltage of the second memory cell MC2 is maintained at the first threshold voltage group G1.

When the data of the first bit BIT1 is "0", the data of the second bit BIT2 is "1" and the data of the third bit BIT3 is "0" (CASE46), the threshold voltage of the first memory cell MC1 is controlled to the third threshold voltage group G3, and the threshold voltage of the second memory cell MC2 is maintained at the first threshold voltage group G1.

When the data of the first bit BIT1 is "0", the data of the second bit BIT2 is "0", and the data of the third bit BIT3 is "1" (CASE47), the threshold voltages of the first and the second memory cells MC1 and MC2 are maintained at the second threshold voltage group G2.

When all of the first, the second, and the third bits BIT1, BIT2 and BIT3 are "0" (CASE48), the threshold voltage of the first memory cell MC1 is maintained at the second threshold voltage group G2, and the threshold voltage of the second memory cell MC2 is controlled to the third threshold voltage group G3.

As described above, in an exemplary method of driving a non-volatile semiconductor memory device of an exemplary disclosed embodiment, the threshold voltages of the first and the second memory cells MC1 and MC2 are simultaneously controlled based on the data of three bits BIT1, BIT2 and BIT3. Furthermore, the three bits are provided sequentially. In addition, for each bit, a programming success or failure can be determined through only one or two verify read operations. Therefore, the overall operating speed of the disclosed non-volatile semiconductor memory device may be remarkably improved during programming.

Thus, in the case of a specific combination of data bits, such as, for example, when the first to third bits BIT1 to BIT3 are 1, 1 and 0, respectively, the threshold voltages of the first and the second memory cells MC1 and MC2 are controlled to the third threshold voltage group G3.

Furthermore, the first bit BIT1 is mapped to the threshold voltage of the first memory cell MC1 with respect to the first reference voltage VR1, for all combinations other than the specific combination of bits. That is, when the first bit BIT1 is "1", the threshold voltage of the first memory cell MC1 is lower than the first reference voltage VR1. In addition, when the first bit BIT1 is "0", the threshold voltage of the first memory cell MC1 is higher than the first reference voltage VR1.

Using a similar method, the second bit BIT2 is mapped to the threshold voltage of the second memory cell MC2 with respect to the first reference voltage VR1, for all combinations other than the specific combination of bits.

Furthermore, the third bit BIT3 is mapped to the threshold voltages of the first and the second memory cells MC1 and MC2 with respect to the second reference voltage VR2. For example, when the third bit BIT3 is "1", the threshold voltage of the first and the second memory cells MC1 and MC2 are lower than the second reference voltage VR2. In addition, when the third bit BIT3 is "0", the threshold voltages of the first memory cell MC1 and/or the second memory cell MC2 are higher than the second reference voltage VR2.

Next, a reading method for the exemplary disclosed non-volatile semiconductor memory device is described. In this case, even if the first to the third page reading steps of reading first to third bits BIT1 to BIT3 are performed out of sequence, it is still possible to read data from a pair of memory cells.

Figure 18A:
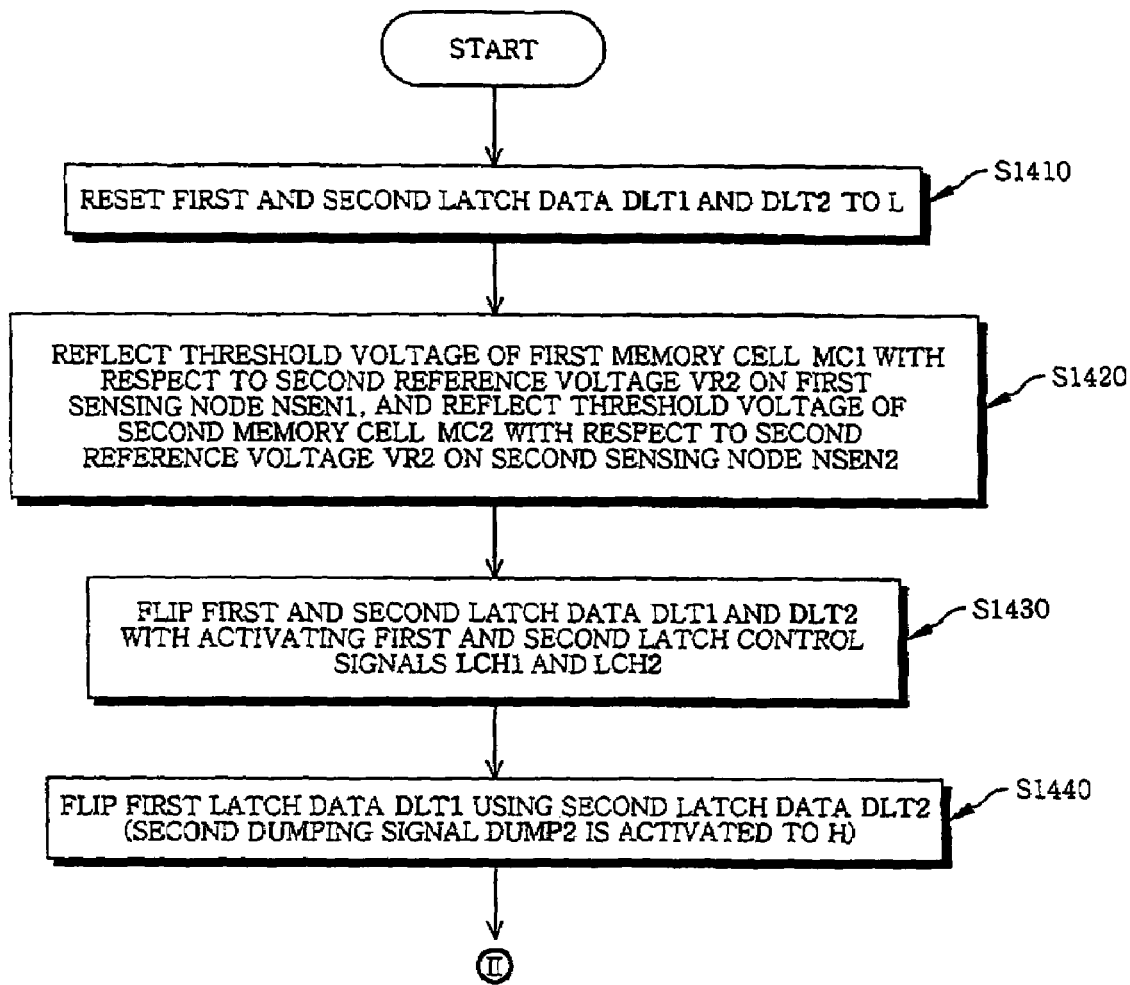
FIGS. 18A and 18B are flowcharts showing a first page reading step in a reading method for an exemplary disclosed non-volatile semiconductor memory device of the present invention.
Figure 18B:
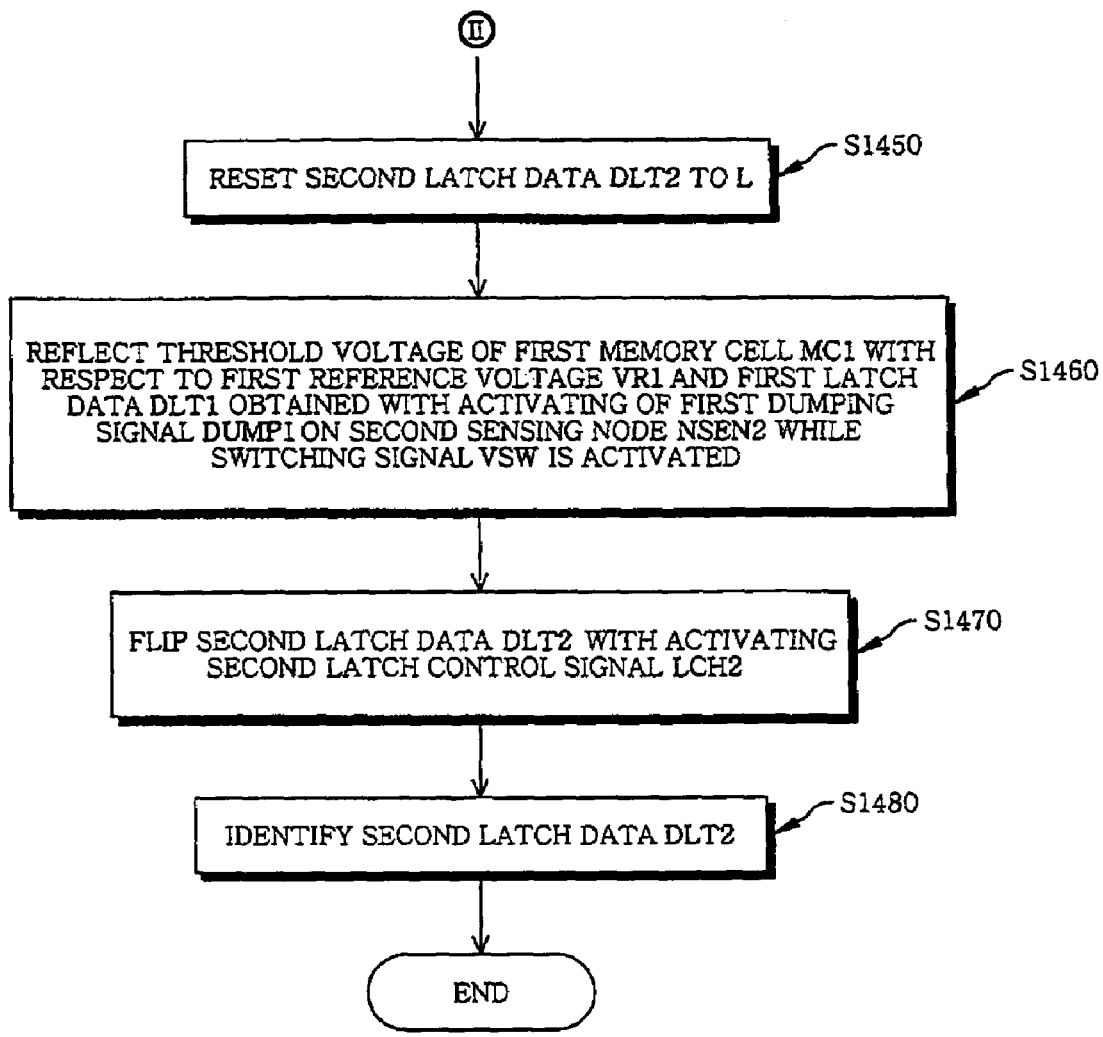
Figure 19A:
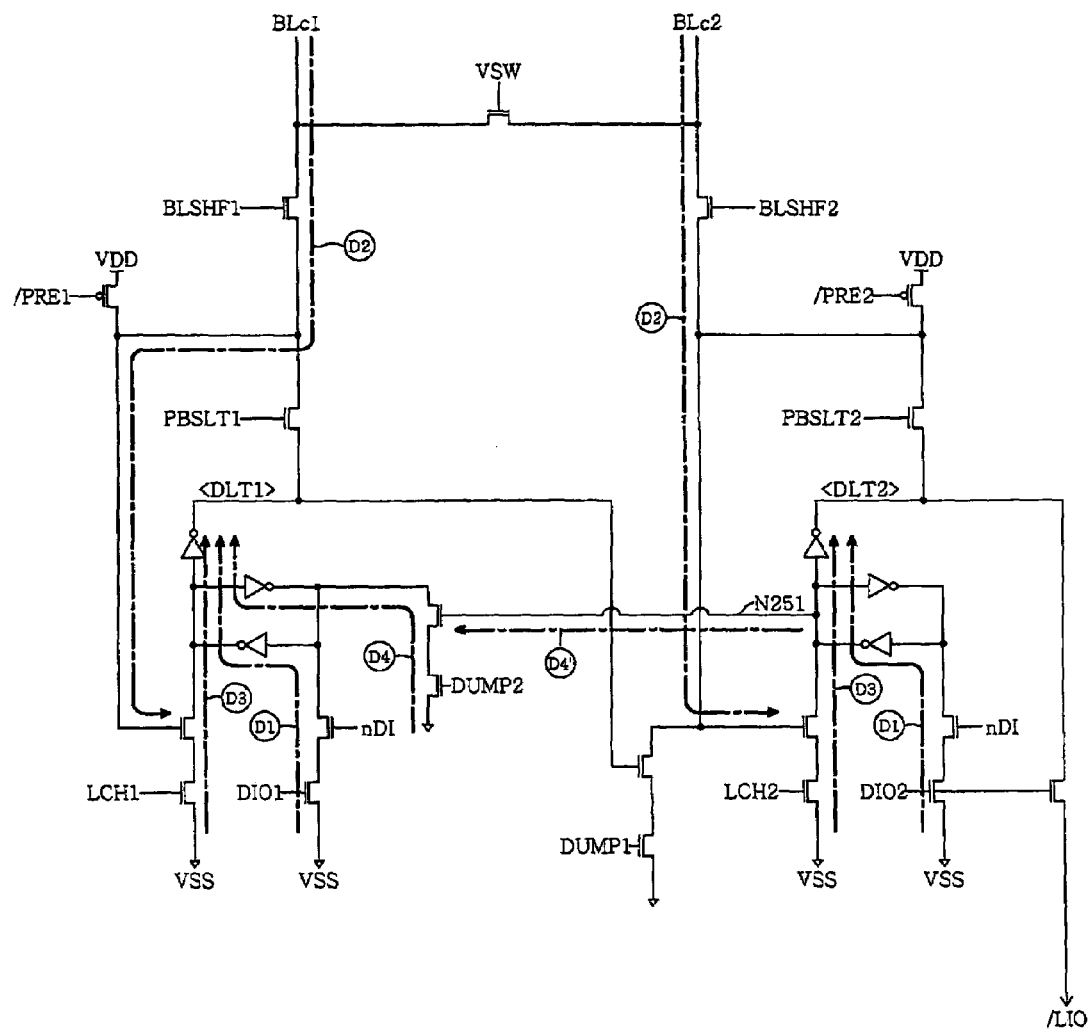
FIGS. 19A and 19B are data flow diagrams based on the flowcharts of FIGS. 18A and 18B.
Figure 19B:
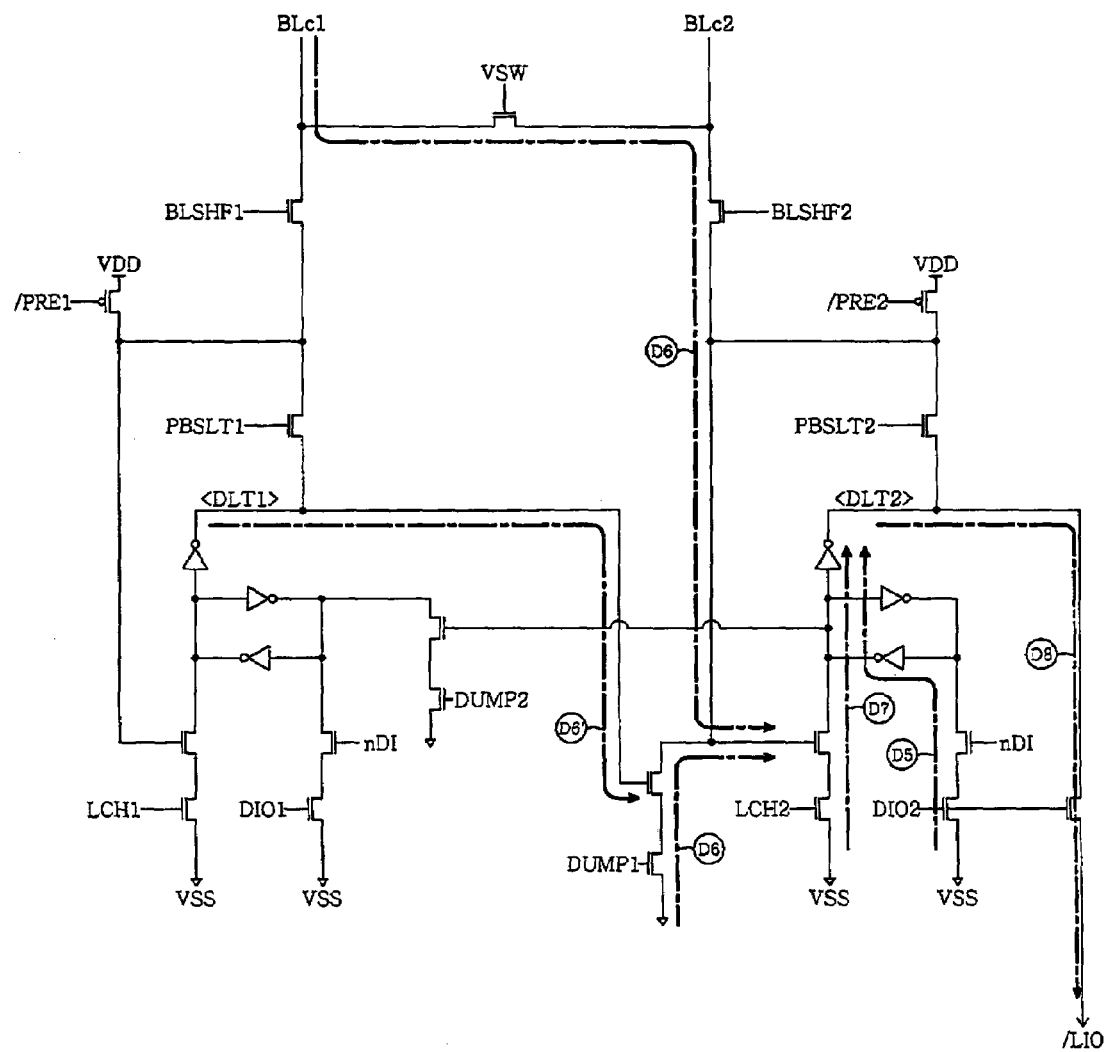

FIGS. 18A and 18B are flowcharts showing a first page reading step in an exemplary method for reading an exemplary disclosed non-volatile semiconductor memory device. FIG. 19A and FIG. 19B are data flow diagrams based on the flowcharts of FIGS. 18A and 18B.

Referring to FIGS. 18A and 18B, at step S1410, the first and the second latch data DLT1 and DLT2 are reset to a logic L state (refer to D1 of FIG. 19A). In this case, an inverted input signal nDI is activated to a logic H state.

Furthermore, at step S1420, the threshold voltage of the first memory cell MC1 with respect to the second reference voltage VR2 is reflected on the first sensing node NSEN1. Similarly, the threshold voltage of the second memory cell MC2 with respect to the second reference voltage VR2 is reflected on the second sensing node NSEN2 (refer to D2 of FIG. 19A).

At step S1430, the first and the second latch control signals LCH1 and LCH2 are generated as H pulses. In this case, the first and the second latch data DLT1 and DLT2 are selectively flipped from a logic L state to a logic H state depending on the voltage level of the first and the second sensing nodes NSEN1 and NSEN2 (refer to D3 of FIG. 19A). As a result, in the cases CASE42 and CASE46 of FIG. 17, the first latch data DLT1 is flipped to a logic H state. Furthermore, in the cases CASE42, CASE44 and CASE48 of FIG. 17, the second latch data DLT2 is flipped to a logic H state.

In addition, at step S1440, the first latch data DLT1 is reversely flipped by the second latch data DLT2. In this case, a second dumping signal DUMP2 is activated to a logic H state (refer to D4 and D4' of FIG. 19A). In an exemplary embodiment, the reverse flip of the first latch data DLT1 depends on the logic state of the node N251. However, because the logic state of the node N251 is opposite to the logic state of the second latch data DLT2, it can be understood that the reverse flip of the first latch data DLT1 depends on the logic state of the second latch data DLT2.

As a result, only in the case CASE42 of FIG. 17 is the first latch data DLT1 in a logic H state. Furthermore, only in cases other than CASE42 is the first latch data DLT1 in a logic L state.

In addition, at step S1450, the second latch data DLT2 is reset to a logic L state. In this case, the inverted input signal nDI is activated to a logic H state (refer to D5 of FIG. 19B).

Thereafter, at steps S1460 and S1470, the step of flipping the first latch data DLT1 from a logic L state to a logic H state is performed using the data of the first memory cell MC1 and the first latch data DLT1 that is flipped at step S1440.

In detail, at step S1460, the threshold voltage of the first memory cell MC1 with respect to the first reference voltage VR1, and the first latch data DLT1 are reflected on the second sensing node NSEN2 (refer to D6 and D6' of FIG. 19B). In this case, the switching signal VSW is activated to a logic H state, so that the first common bit line BLc1 is connected to the second common bit line BLc2. Furthermore, the first dumping signal DUMP1 is activated to a logic H state.

Furthermore, at step S1470, the second latch data DLT2 is flipped from a logic L state to a logic H state using the voltage level of the second sensing node NSEN2 obtained at step S1460 (refer to D7 of FIG. 19B).

The variation in the logic state of the second latch data DLT2 that occurs at step S1470 will now be described. Thus, when the threshold voltage of the first memory cell MC1 is lower than the first reference voltage VR1 (CASE41, CASE43 and CASE44 of FIG. 17) and when the first latch data DLT1 is in a logic H state (CASE42 of FIG. 17), the second latch data DLT2 is maintained at a logic L state.

In the remaining cases (CASE45 to CASE 48 of FIG. 17), the second latch data DLT2 is flipped from a logic L state to a logic H state.

At step S1480, the data of the first bit BIT1 is performed. In particular, the second output control signal DIO2 is generated as an H pulse, and the logic state of the second latch data DLT2 is read and provided to the outside of the semiconductor memory device. (refer to D9 of FIG. 19B).

In an exemplary embodiment, output data having a logic H state means that the data of the first bit BIT1 is "0" and output data having a logic L state means that the data of the first bit BIT1 is "1". Thus, according to a method of driving an exemplary disclosed non-volatile semiconductor memory device, the data of the first bit BIT1 can be identified through a single read operation.

Next, a second page reading step in a reading method for an exemplary disclosed non-volatile semiconductor memory device is described.

Figure 20A:
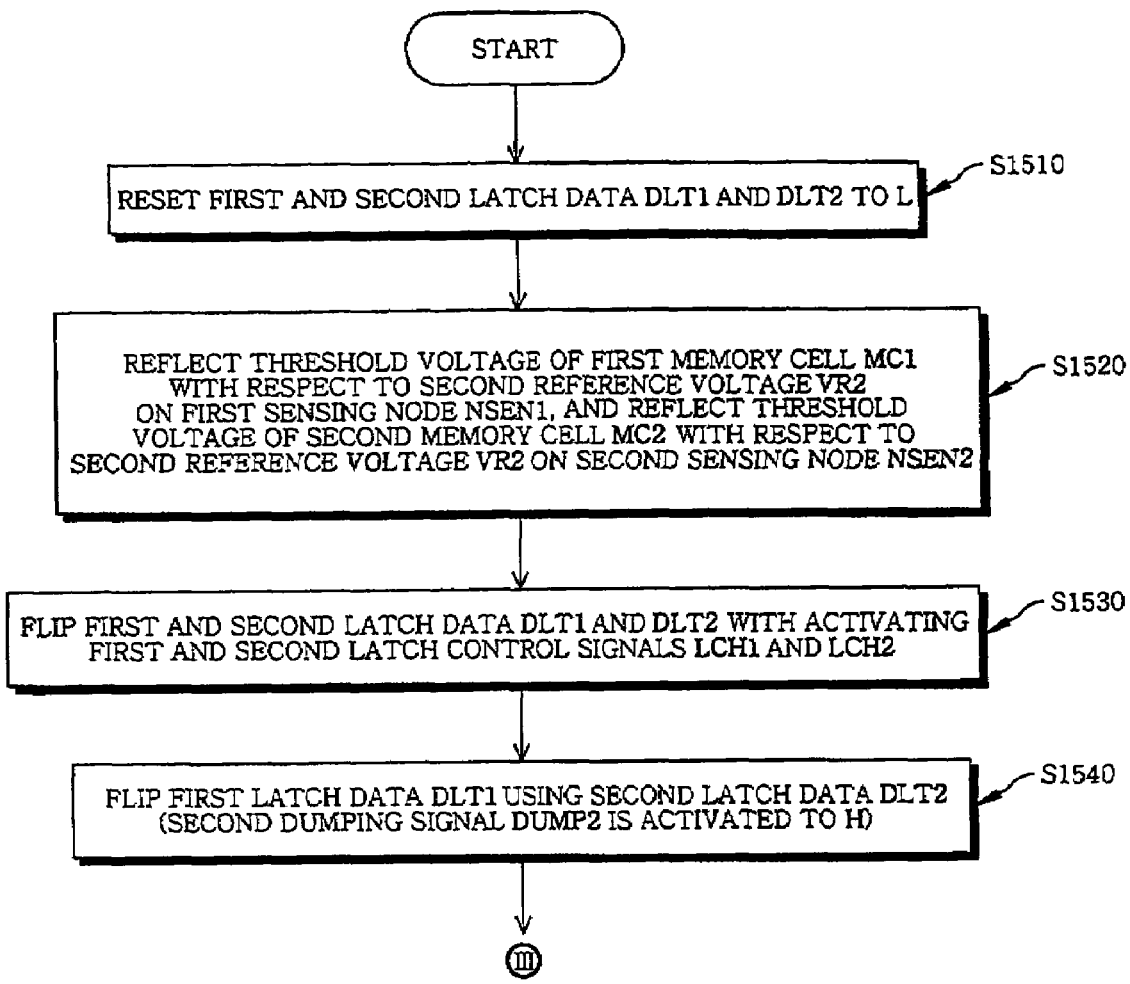
FIGS. 20A and 20B are flowcharts showing a second page reading step in a reading method for an exemplary disclosed non-volatile semiconductor memory device of the present invention.
Figure 20B:
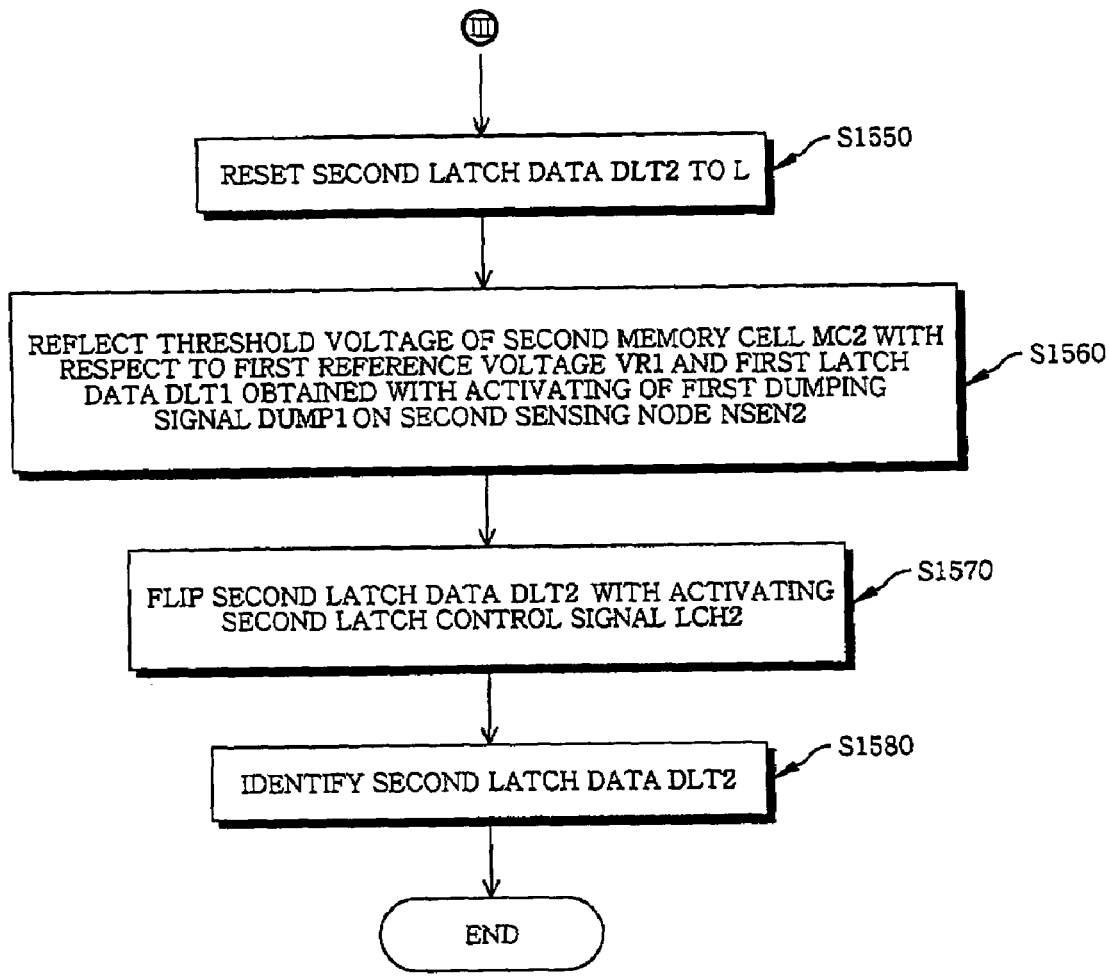

FIGS. 20A and 20B are flowcharts showing a second page reading step in a reading method for an exemplary disclosed non-volatile semiconductor memory device. In addition, FIGS. 21A and 21B are data flow diagrams based on the flowcharts of FIGS. 20A and 20B.

Figure 21A:
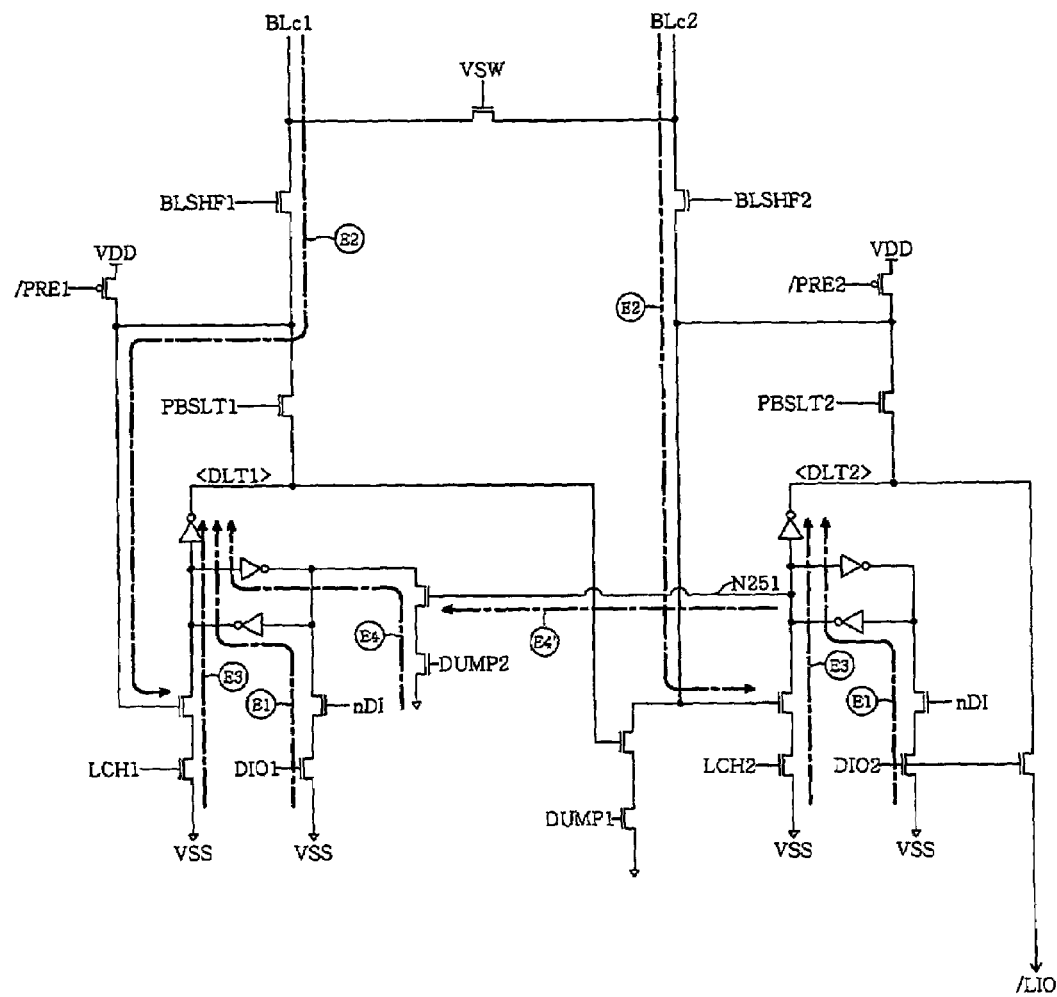
FIGS. 21A and 21B are data flow diagrams based on the flowcharts of FIGS. 20A and 20B.
Figure 21B:
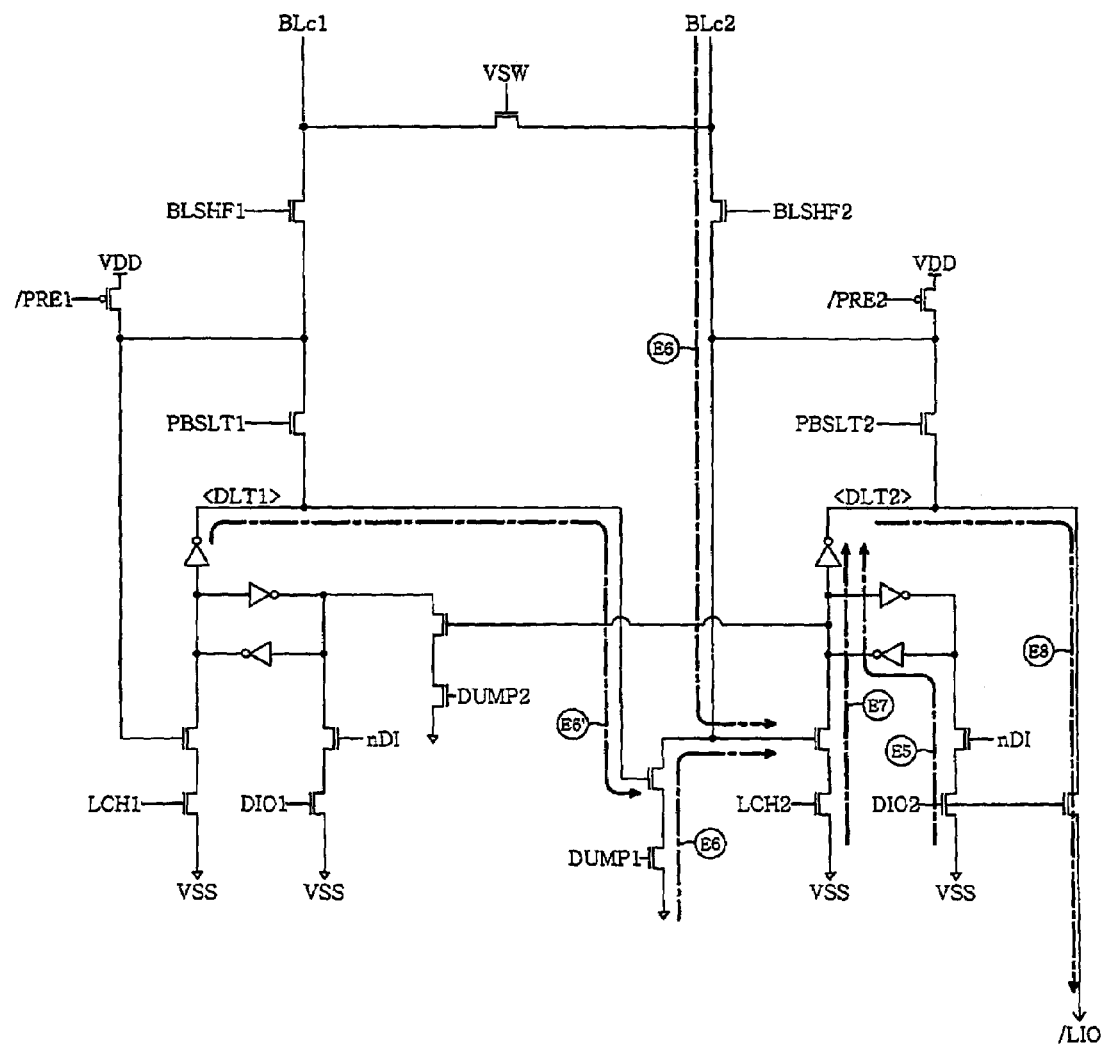

Referring to FIGS. 20A and 20B, at step S1510, the first and the second latch data DLT1 and DLT2 are reset to a logic L state (refer to E1 of FIG. 21A). In this case, an inverted input signal nDI is activated to a logic H state.

Furthermore, at step S1520, the threshold voltage of the first memory cell MC1 with respect to the second reference voltage VR2 is reflected on the first sensing node NSEN1. Similarly, the threshold voltage of the second memory cell MC2 with respect to the second reference voltage VR2 is reflected on the second sensing node NSEN2 (refer to E2 of FIG. 21A).

At step S1530, the first and the second latch control signals LCH1 and LCH2 are generated as H pulses. In this case, the first and the second latch data DLT1 and DLT2 are flipped from a logic L state to a logic H state depending on the voltage levels of the first and the second sensing nodes NSEN1 and NSEN2 (refer to E3 of FIG. 21A). As a result, in the cases CASE42 and CASE46 of FIG. 17, the first latch data DLT1 is flipped to a logic H state. Furthermore, in the cases CASE42, CASE44 and CASE48 of FIG. 17, the second latch data DLT2 is flipped to a logic H state.

In addition, at step S1540, the first latch data DLT1 is reversely flipped by the second latch data DLT2. In this case, a second dumping signal DUMP2 is activated to a logic H state (refer to E4 and E4' of FIG. 21A). In an exemplary embodiment, the reverse flip of the first latch data DLT1 depends on the logic state of the node N251. However, because the logic state of the node N251 is opposite to the logic state of the second latch data DLT2, it can be understood that the reverse flip of the first latch data DLT1 depends on the logic state of the second latch data DLT2.

As a result, only in the case CASE42 of FIG. 17 is the first latch data DLT1 in a logic H state. Furthermore, only in cases other than CASE42 is the first latch data DLT1 in a logic L state.

In addition, at step S1550, the second latch data DLT2 is reset to a logic L state. In this case, the inverted input signal nDI is activated to a logic H state (refer to E5 of FIG. 21B).

Thereafter, at steps S1560 and S1570, the step of flipping the first latch data DLT1 from a logic L state to a logic H state is performed using the data of the first memory cell MC1 and the first latch data DLT1 that is flipped at step S1540.

In detail, at step S1560, the threshold voltage of the second memory cell MC2 with respect to the first reference voltage VR1, and the second latch data DLT2 are reflected on the second sensing node NSEN2 (refer to E6 and E6' of FIG. 21B). In this case, the first dumping signal DUMP1 is activated to a logic H state.

Furthermore, at step S1570, the second latch data DLT2 is flipped from a logic L state to a logic H state using the voltage level of the second sensing node NSEN2 obtained at step S1560 (refer to E7 of FIG. 21B).

The variation in the logic state of the second latch data DLT2 at step S1570 is described below. That is, when the threshold voltage of the second memory cell MC2 is lower than the first reference voltage VR1 (CASE41, CASE45 and CASE46 of FIG. 17) and when the first latch data DLT1 is in a logic H state (CASE42 of FIG. 17), the second latch data DLT2 is maintained in a logic L state.

In the remaining cases (CASE43, CASE44, CASE47 and CASE 48 of FIG. 17), the second latch data DLT2 is flipped from a logic L state to a logic H state.

At step S1580, the second output control signal DIO2 is generated as an H pulse, and the logic state of the second latch data DLT2 is read and provided to the outside of the semiconductor memory device. This reading of the logic state of the second latch data DLT2 identifies the data of the second bit BIT2. (refer to E8 of FIG. 21B).

Thus, in an exemplary embodiment of the disclosed non-volatile semiconductor memory device, output data having a logic H state means that the data of the second bit BIT2 is "0", and output data having a logic L state means that the data of the second bit BIT2 is "1". Therefore, in a method of driving an exemplary disclosed non-volatile semiconductor memory device, the data of the second bit BIT2 can be identified through a single read operation.

Figure 22:
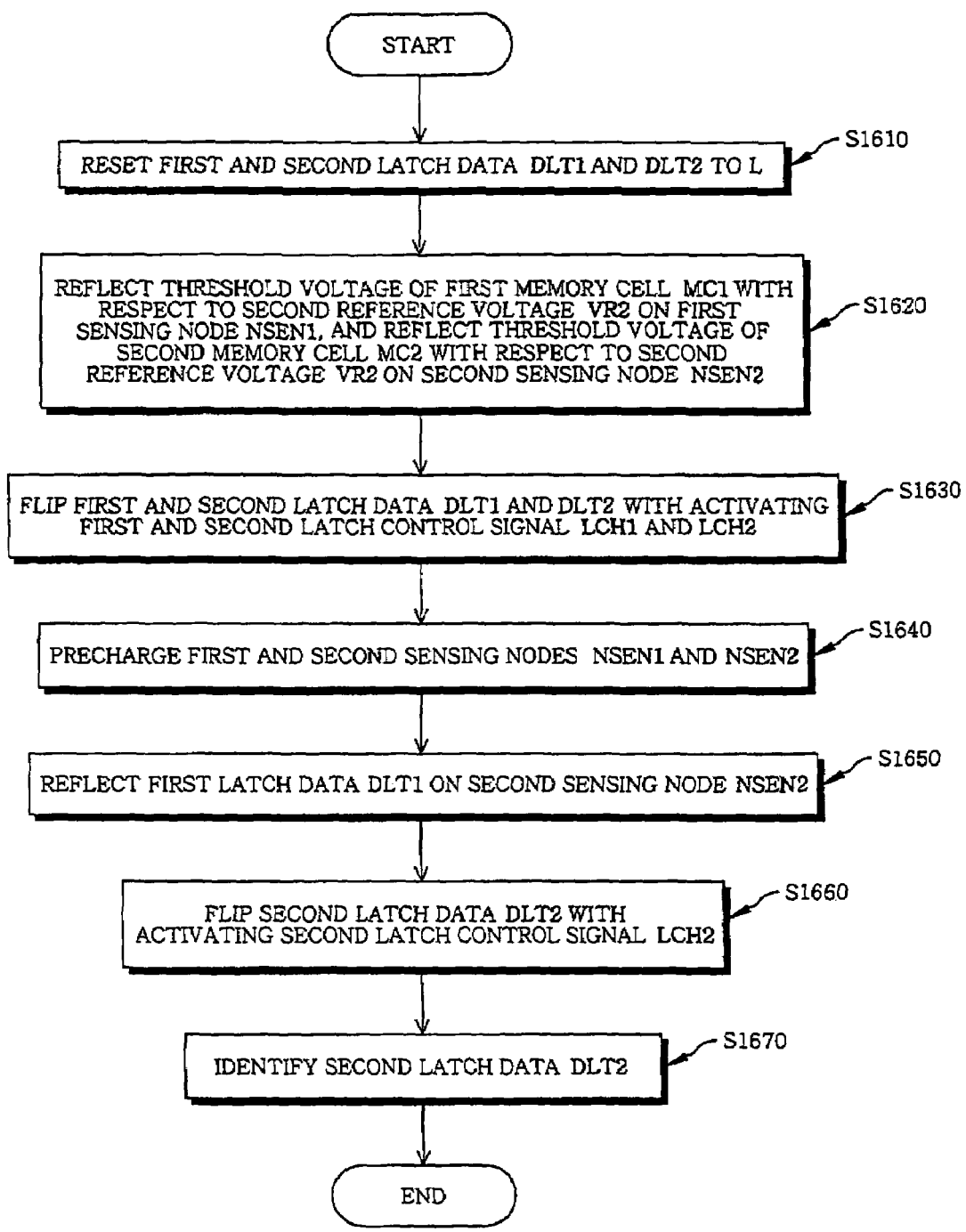
FIG. 22 is a flowchart showing a third page reading step in a reading method for an exemplary disclosed non-volatile semiconductor memory device of the present invention.
Figure 23:
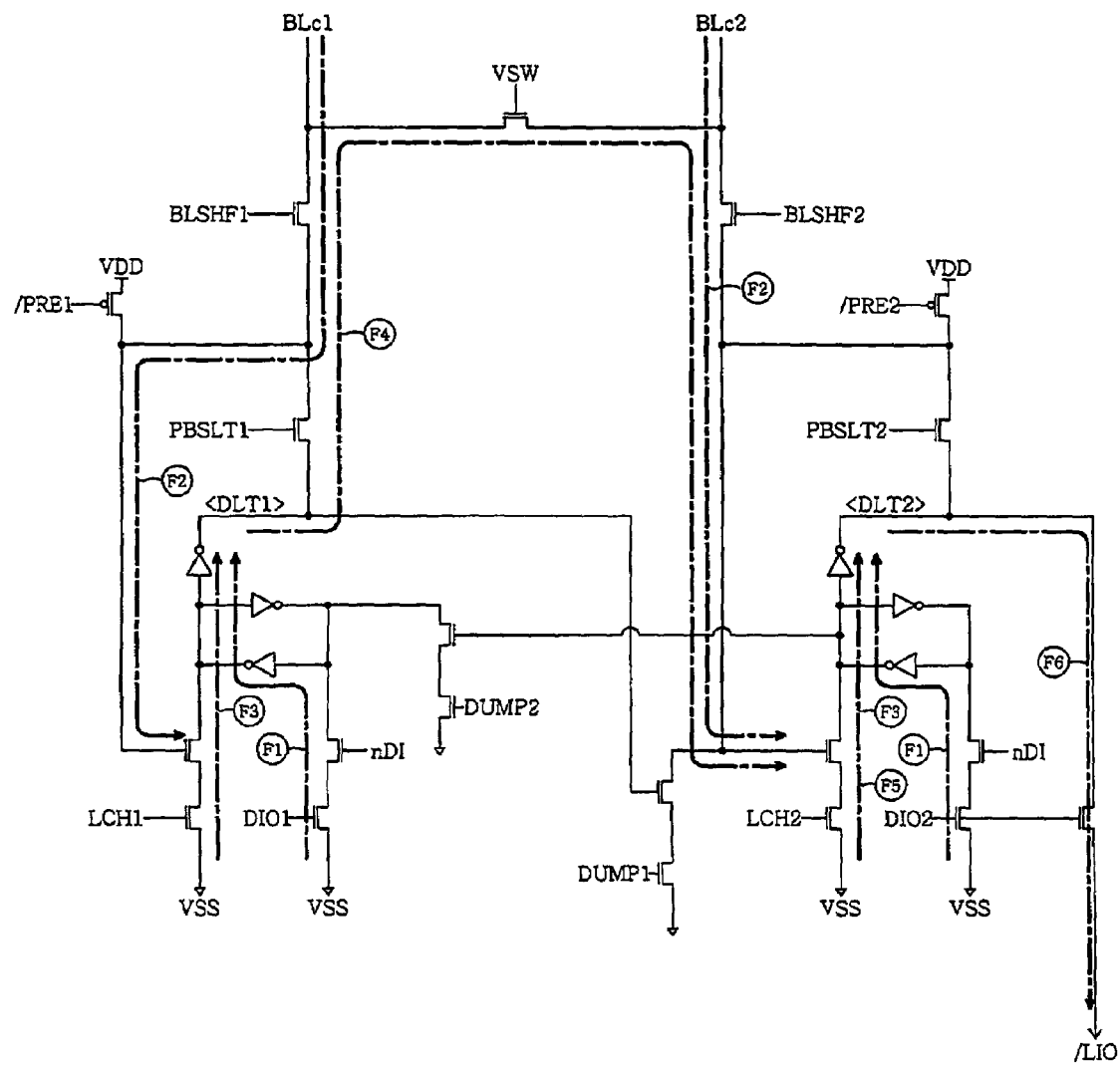
FIG. 23 is a data flow diagram based on the flowchart of FIG. 22.

FIG. 22 is a flowchart illustrating a third page reading step in a reading method for an exemplary disclosed non-volatile semiconductor memory device. FIG. 23 is a data flow diagram based on the flowchart of FIG. 22. At the third page reading step, the threshold voltages of the first and the second memory cells MC1 and MC2 are identified, so that data of a third bit BIT3 is read.

Referring to FIG. 22, at step S1610, the first and the second latch data DLT1 and DLT2 are reset to a logic L state (refer to F1 of FIG. 23). In this case, the inverted input signal nDI is activated to a logic H state.

At step S1620, the threshold voltage of the first memory cell MC1 with respect to the second reference voltage VR2 is reflected on the first sensing node NSEN1. Similarly, the threshold voltage of the second memory cell MC2 with respect to the second reference voltage VR2 is reflected on the second sensing node NSEN2 (refer to F2 of FIG. 23).

At step S1630, the first and the second latch control signals LCH1 and LCH2 are generated as H pulses. In this case, the first and the second latch data DLT1 and DLT2 are selectively flipped from a logic L state to a logic H state depending on the voltage levels of the first and the second sensing nodes NSEN1 and NSEN2 (refer to F3 of FIG. 23). As a result, in the cases CASE42 and CASE46 of FIG. 17, the first latch data DLT1 is reversely flipped to a logic L state. On the other hand, in the cases CASE42 and CASE46 of FIG. 17, the first latch data DLT1 is flipped to a logic H state. Also, in the cases CASE42, CASE44 and CASE48 of FIG. 17, the second latch data DLT2 is flipped to a logic H state.

At step S1640, the first and the second sensing nodes NSEN1 and NSEN2 are precharged to the level of the supply voltage VDD. At step S1650, the first latch data DLT1 is reflected on the second sensing node NSEN2 (refer to F4 of FIG. 23). In this case, the switching signal VSW is activated to a logic H state. As a result, in the cases CASE42 and CASE46 of FIG. 17, the second sensing node NSEN2 is maintained at the level of the supply voltage VDD, but, in the remaining cases, the second sensing node NSEN2 is controlled to the level of the ground voltage VSS.

Furthermore, at step S1660, the second latch data DLT2 is flipped from a logic L state to a logic H state using the voltage level of the second sensing node NSEN2 obtained at step S1650 (refer to F5 of FIG. 23). The variation in the logic state of the second latch data DLT2 that occurs at step S1660 is described below.

When the threshold voltage of the first or the second memory cell MC1 or MC2 is higher than the second reference voltage VR2 (CASE42, CASE44, CASE46 and CASE48 of FIG. 17), the second latch data DLT2 is flipped from a logic L state to a logic H state. In the remaining cases (CASE41, CASE43, CASE45 and CASE 47 of FIG. 17), the second latch data DLT2 is maintained in a logic L state.

At step S1670, the second output control signal DIO2 is generated as an H pulse. In addition, the logic state of the second latch data DLT2 is read and provided to the outside of the semiconductor memory device. This reading of the logic state of the second latch data DLT2 identifies the data of the third bit BIT3. (refer to F6 of FIG. 23).

In an exemplary embodiment, output data having a logic H state means that the data of the third bit BIT3 is "0" and output data having a logic L state means that the data of the third bit BIT3 is "1". Thus, as described above, according to a method of driving an exemplary disclosed non-volatile semiconductor memory device, the data of the third bit BIT3 can be identified through a single read operation.

Therefore, according to a reading method for the exemplary disclosed non-volatile semiconductor memory device, each of first to third bits BIT1 to BIT3 can be identified through only a single data output operation.

Meanwhile, the page buffer 200 can be modified to various structures without departing from the scope of the invention.

Figure 24:
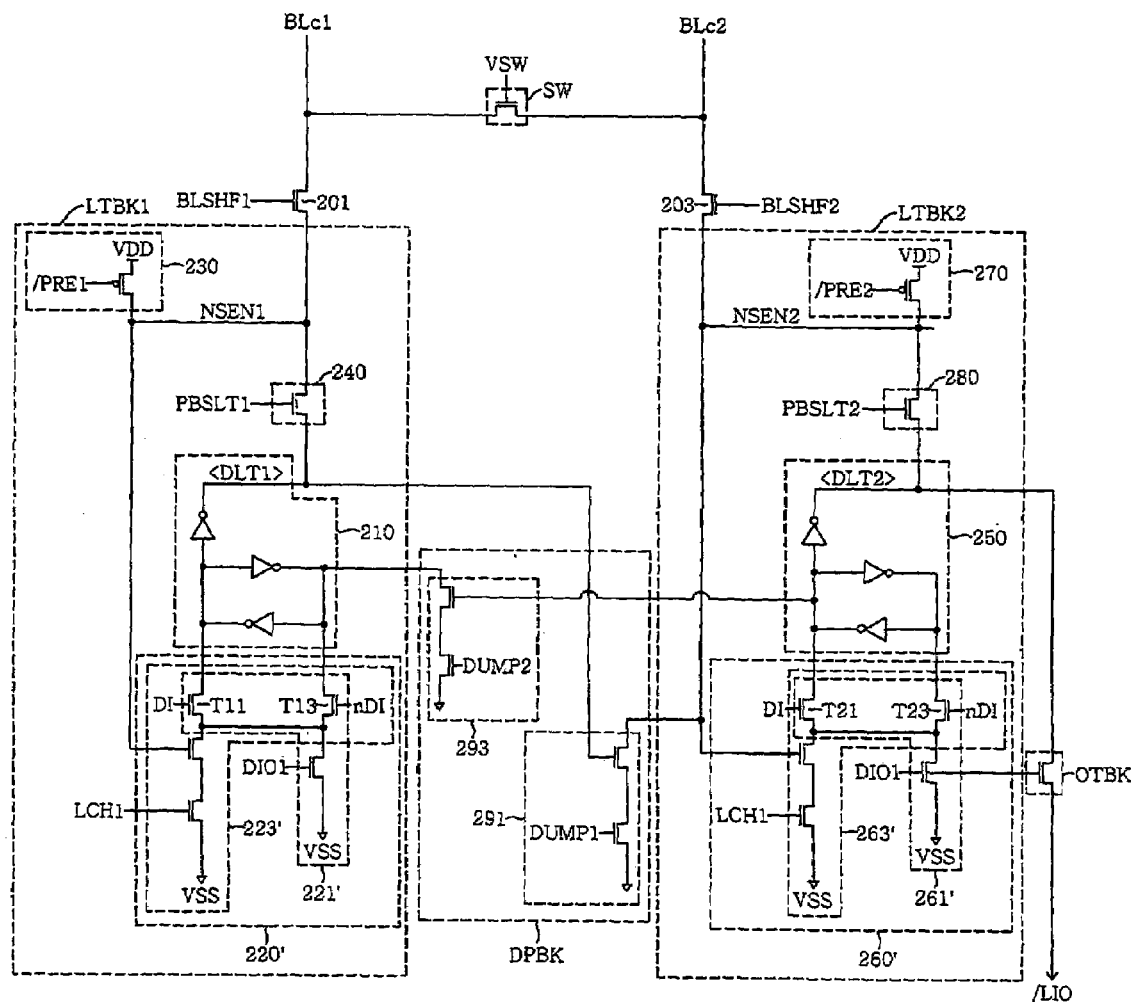
FIG. 24 is a diagram illustrating another example of the page buffer of an exemplary disclosed nonvolatile semiconductor memory device according to the prevent invention.

FIG. 24 is a diagram illustrating another example of the page buffer 200 of an exemplary disclosed nonvolatile semiconductor memory device. The construction of the page buffer of FIG. 24 is almost the same as that of the page buffer of FIG. 7. However, there are some differences between the two devices. For example, there is a difference between the first latch control unit 220' in the first latch block LTBK1 of FIG. 24 and the first latch control unit 220 in the first latch block LTBK1 of FIG. 7. Furthermore, there is also a difference between the second latch control unit 260' in the second latch block LTBK2 of FIG. 24 and the second latch control unit 260 in the second latch block LTBK2 of FIG. 7.

Therefore, in this disclosure, the first latch control unit 220' of the first latch block LTBK1 and the second latch control unit 260' of the second latch block LTBK2 of FIG. 24 is described in detail.

The first latch control unit 220' includes a first setting control unit 221' and a first flip unit 223'. Specifically, the first setting control unit 221' is controlled to set the first latch data DLT1 as a logic H state. In this case, the input signal DI is activated to a logic H state. Similarly, the first setting control unit 221' is controlled to reset the first latch data DLT1 as a logic L state. In this case, the inverted input signal nDI is activated to a logic H state.

The first flip unit 223' is controlled to flip the first latch data DLT1 from "L" to "H" depending on the voltage level of the first sensing node NSEN1. In this case, the input signal DI is activated to a logic H state. In addition, the first flip unit 223' is controlled to flip reversely the first latch data DLT1 from "H" to "L" depending on the voltage level of the first sensing node NSEN1. In this case, the inverted input signal nDI is activated to a logic H state.

In an exemplary embodiment, NMOS transistors T11 and T13 are included in both of the first setting control unit 221' and the first flip unit 223'. In particular, the NMOS transistor T11 is gated by the input signal DI. Furthermore, the NMOS transistor T13 is gated by the inverted input signal nDI.

The second latch control unit 260' includes a second setting control unit 261' and a second flip unit 223'. The second setting control unit 261' is controlled to set the second latch data DLT2 in a logic H state. In this case, the input signal DI is activated to a logic H state. Furthermore, the second setting control unit 261' is controlled to reset the second latch data DLT2 as a logic L state. In this case, the inverted input signal nDI is activated to a logic H state.

The second flip unit 263' is controlled to flip the second latch data DLT2 from "L" to "H" depending on the voltage level of the second sensing node NSEN2. In this case, the input signal DI is activated to a logic H state. In addition, the second flip unit 263' is controlled to flip reversely the second latch data DLT2 from "H" to "L" depending on the voltage level of the second sensing node NSEN2. In this case, the inverted input signal nDI is activated to a logic H state.

In an exemplary embodiment, NMOS transistors T21 and T23 are included in both of the second setting control unit 261' and the second flip unit 263'. Specifically, the NMOS transistor T21 is gated by the input signal DI. In addition, the NMOS transistor T23 is gated by the inverted input signal nDI.

As described above, the disclosed exemplary non-volatile semiconductor memory device includes memory cells which can be controlled to three threshold voltage levels and a page buffer that controls the memory cells. The disclosed non-volatile semiconductor memory device may have a higher degree of integration than a 2-level non-volatile semiconductor memory device. Furthermore, the disclosed non-volatile semiconductor memory device may have higher reliability than a 4-level non-volatile semiconductor memory device.

Furthermore, in the disclosed non-volatile semiconductor memory device, first and second memory cells forming a pair are separately arranged in a pair of first and second even strings and a pair of first and second odd strings. Therefore, when the first and second memory cells of the first and second even strings are selected and driven, the first and second odd bit lines function as shielding lines. In addition, when the first and second memory cells of the first and the second odd strings are selected and driven, the first and the second even bit lines function as shielding lines.

As described above, the even bit lines or the odd bit lines function as shielding lines, so that noise and coupling can be prevented, thus improving the operating characteristics of the disclosed non-volatile semiconductor memory device Although the preferred embodiments of the disclosed non-volatile semiconductor memory device have been shared for illustrative purposes, those skilled in the art will appreciate that various modifications, additions and substitutions are possible, without departing from the scope and spirit of the invention as disclosed in the accompanying claims. Therefore, the technical scope of the present invention should be defined by the technical spirit of the accompanying claims.

What is claimed is:

1. A nonvolatile semiconductor memory device, comprising:
   a memory array having nonvolatile memory cells;
   a page buffer coupled to the memory array through first and second common bit lines and configured to map a set of first to third bit data to threshold voltage levels of a pair of first and second memory cells; and
   a row decoder configured to control a word line of a selected memory cell of the memory array,
   wherein the page buffer comprises:
   a switch configured to connect the first common bit line to the second common bit line;
   a first latch block configured to store a first latch data, the first latch block connected to the first common bit line through a first sensing node;
   a second latch block configured to store a second latch data, the second latch block connected to the second common bit line through a second sensing node;
   a dumping block configured to control a voltage level of the second sensing node according to the first latch data, and to flip the first latch data of the first latch block according to the voltage level of the second sensing node; and
   an output block configured to output data according to the second latch data to an internal data line.

2. The nonvolatile semiconductor memory device of claim 1, wherein the first latch block comprises:
   the first sensing node;
   a first latch unit configured to store the first latch data;
   a first precharge unit configured to precharge the first sensing node;
   a first buffer selection unit configured to provide the first latch data to the first sensing node in response to a first buffer selection signal; and
   a first latch control unit configured to reset the first latch data, and to flip the first latch data according to a voltage level of the first sensing node.

3. The nonvolatile semiconductor memory device of claim 2, wherein the first latch unit comprises:
   a first reset unit configured to reset the first latch data; and
   a first flip unit configured to flip the first latch data according to the voltage level of the first sensing node.

4. The nonvolatile semiconductor memory device of claim 3, wherein the first flip unit comprises:
   a first sensing transistor gated to the first sensing node and connected to the first latch unit; and
   a first latch control transistor gated to a first latch control signal and connected in series with the first sensing transistor, the first latch control transistor providing a source voltage to the first sensing transistor.

5. The nonvolatile semiconductor memory device of claim 1, wherein the second latch block comprises:
   the second sensing node;
   a second latch unit configured to store the second latch data;
   a second precharge unit configured to precharge the second sensing node;
   a second buffer selection unit configured to provide the second latch data to the second sensing node in response to a second buffer selection signal; and
   a second latch control unit configured to reset the second latch data and to flip the second latch data according to the voltage level of the second sensing node.

6. The nonvolatile semiconductor memory device of claim 5, wherein the second latch unit comprises:
   a second reset unit configured to reset the second latch data; and
   a second flip unit configured to flip the second latch data according to the voltage level of the second sensing node.

7. The nonvolatile semiconductor memory device of claim 6, wherein the second flip unit comprises:
   a second sensing transistor gated to the second sensing node and connected to the second latch unit; and
   a second latch control transistor gated to a second latch control signal and connected in series with the second sensing transistor, the second latch control transistor providing a source voltage to the second sensing transistor.

8. The nonvolatile semiconductor memory device of claim 1, wherein the dumping block comprises:
   a first dumping unit configured to control the voltage level of the second sensing node according to the first latch data; and
   a second dumping unit configured to reverse-flip the first latch data according to the voltage level of the second sensing node.

9. The nonvolatile semiconductor memory device of claim 1, wherein the memory array comprises:
   a first even string and a first odd string connected to a first even bit line and a first odd bit line, respectively; and
   a second even string and a second odd string connected to a second even bit line and a second odd bit line, respectively,
   wherein the first even bit line and the first odd bit line are selectively connected to the first common bit line during a data program operation and a read operation, and
   wherein the second even bit line and the second odd bit line are selectively connected to the second common bit line during the data program operation and the read operation.

10. The nonvolatile semiconductor memory device of claim 9, wherein a pair of first and second memory cells are located separately and controlled with a single word line.

11. The nonvolatile semiconductor memory device of claim 1, wherein the nonvolatile semiconductor memory device is NAND type nonvolatile semiconductor memory device.

12. A page buffer of a nonvolatile semiconductor device, comprising:
   a sensing node;
   a latch unit configured to store latch data;
   a precharge unit configured to precharge the sensing node;
   a buffer selection unit configured to provide the latch data to the sensing node in response to a buffer selection signal; and
   a latch control unit which includes a reset unit configured to reset the latch data, and a flip unit configured to flip the latch data according to a voltage level of the sensing node.

13. The page buffer of claim 12, wherein the flip unit comprises:
   a sensing transistor gated to the sensing node and connected to the latch unit; and
   a latch control transistor gated to a latch control signal and connected in series with the latch sensing transistor, the latch control transistor providing a source voltage to the latch sensing transistor.

* * * * *